(12) United States Patent
Kondo

(10) Patent No.: US 10,389,353 B2
(45) Date of Patent: Aug. 20, 2019

(54) OPTICAL SWITCH

(71) Applicant: FUJI XEROX CO., LTD., Tokyo (JP)

(72) Inventor: Takashi Kondo, Kanagawa (JP)

(73) Assignee: FUJI XEROX CO., LTD., Minato-Ku, Tokyo (JP)

( * ) Notice: Subject to any disclaimer, the term of this patent is extended or adjusted under 35 U.S.C. 154(b) by 145 days.

(21) Appl. No.: 15/625,018

(22) Filed: Jun. 16, 2017

(65) Prior Publication Data

US 2018/0006645 A1 Jan. 4, 2018

(30) Foreign Application Priority Data

Jun. 30, 2016 (JP) ................................. 2016-129756

(51) Int. Cl.
| | |
|---|---|
| *H03K 17/79* | (2006.01) |
| *H01L 31/12* | (2006.01) |
| *H01L 31/111* | (2006.01) |

(52) U.S. Cl.
CPC .......... *H03K 17/79* (2013.01); *H01L 31/1113* (2013.01); *H01L 31/125* (2013.01)

(58) Field of Classification Search
CPC .... H01L 31/125; H01L 31/12; H01L 31/1116; H01L 31/1113; H01L 31/111; H01L 33/02; H01L 29/74; H01L 29/87; H03K 17/56; H03K 17/79; H03K 17/78; H03K 3/42
See application file for complete search history.

(56) References Cited

U.S. PATENT DOCUMENTS

| | | | | |
|---|---|---|---|---|
| 5,132,982 A | * | 7/1992 | Chan ................... | H01L 31/1105 257/197 |
| 5,361,273 A | * | 11/1994 | Kosaka ............... | H01L 31/1105 257/84 |
| 5,404,373 A | * | 4/1995 | Cheng ....................... | G06E 1/04 257/E31.102 |
| 5,434,434 A | * | 7/1995 | Kasahara ........... | G02B 6/12004 257/432 |
| 5,451,977 A | * | 9/1995 | Kusuda ...................... | B41J 2/45 257/21 |
| 5,550,856 A | * | 8/1996 | Cheng ....................... | G06E 1/04 257/E31.102 |

(Continued)

FOREIGN PATENT DOCUMENTS

| | | |
|---|---|---|
| JP | 01-238962 A | 9/1989 |
| JP | 2001-308385 A | 11/2001 |
| JP | 2009-286048 A | 12/2009 |

OTHER PUBLICATIONS

Ping Zhou et al., "Cascadable, Latching Photonic Switch with High Optical Gain by the Monolithic Integration of a Vertical-Cavity Surface-Emitting Laser and a pn-pn Photothyristor," IEEE Transactions Photonics Technology Letters, Nov. 11, 1991, pp. 1009-1012, vol. 3, No. 11.

*Primary Examiner* — John R Lee
(74) *Attorney, Agent, or Firm* — Sughrue Mion, PLLC

(57) ABSTRACT

An optical switch includes: a photothyristor that is switched from an off state to an on state by incident light; a light-emitting element that emits outgoing light when the photothyristor is in the on state; and a tunnel junction layer or a III-V compound layer having metallic conductivity. The tunnel junction layer or the III-V compound layer is disposed between the photothyristor and the light-emitting element.

22 Claims, 21 Drawing Sheets

(56) References Cited

U.S. PATENT DOCUMENTS

| | | | | |
|---|---|---|---|---|
| 5,625,636 A * | 4/1997 | Bryan | | G02B 6/12004 |
| | | | | 372/50.124 |
| 5,666,376 A * | 9/1997 | Cheng | | G06E 1/04 |
| | | | | 250/214 LS |
| 5,677,552 A * | 10/1997 | Ogura | | B82Y 20/00 |
| | | | | 257/113 |
| 5,814,841 A * | 9/1998 | Kusuda | | B41J 2/45 |
| | | | | 224/238 |
| 6,614,055 B1 * | 9/2003 | Kusuda | | B41J 2/45 |
| | | | | 257/107 |
| 7,948,004 B2 * | 5/2011 | Suzuki | | G03G 15/326 |
| | | | | 257/116 |
| 8,564,013 B2 * | 10/2013 | Fukunaga | | B41J 2/451 |
| | | | | 257/102 |
| 8,659,035 B2 * | 2/2014 | Kondo | | B41J 2/45 |
| | | | | 257/88 |
| 9,147,817 B2 * | 9/2015 | Fukunaga | | H01L 33/507 |
| 9,417,552 B2 * | 8/2016 | Kim | | H05B 33/0842 |
| 10,038,305 B2 * | 7/2018 | Kondo | | G03G 15/04054 |
| 10,079,473 B2 * | 9/2018 | Kondo | | H01S 5/042 |
| 2002/0121647 A1 * | 9/2002 | Taylor | | B82Y 20/00 |
| | | | | 257/192 |
| 2003/0063642 A1 * | 4/2003 | Aggerstam | | H01S 5/18338 |
| | | | | 372/45.01 |
| 2003/0169795 A1 * | 9/2003 | Otoma | | B82Y 20/00 |
| | | | | 372/46.013 |
| 2006/0119669 A1 * | 6/2006 | Sharma | | B41J 2/03 |
| | | | | 347/82 |
| 2007/0057268 A1 * | 3/2007 | Hamanaka | | B41J 2/451 |
| | | | | 257/98 |
| 2009/0297223 A1 | 12/2009 | Suzuki | | |
| 2012/0008659 A1 * | 1/2012 | Kawakita | | H01S 5/18311 |
| | | | | 372/45.01 |
| 2016/0365284 A1 * | 12/2016 | Taylor | | H01L 21/8249 |
| 2016/0365475 A1 * | 12/2016 | Taylor | | H01L 33/0062 |
| 2016/0365476 A1 * | 12/2016 | Taylor | | H01L 33/0075 |
| 2016/0365479 A1 * | 12/2016 | Takeuchi | | H01L 33/04 |
| 2017/0277065 A1 * | 9/2017 | Kondo | | G03G 15/04054 |
| 2018/0006432 A1 * | 1/2018 | Kondo | | H01S 5/042 |
| 2018/0006645 A1 * | 1/2018 | Kondo | | H03K 17/79 |
| 2018/0031362 A1 * | 2/2018 | Kondo | | G01B 9/02007 |
| 2018/0034578 A1 * | 2/2018 | Kondo | | H04B 10/506 |
| 2018/0233534 A1 * | 8/2018 | Kondo | | H01L 27/15 |
| 2018/0309890 A1 * | 10/2018 | Kondo | | B41J 2/447 |

* cited by examiner

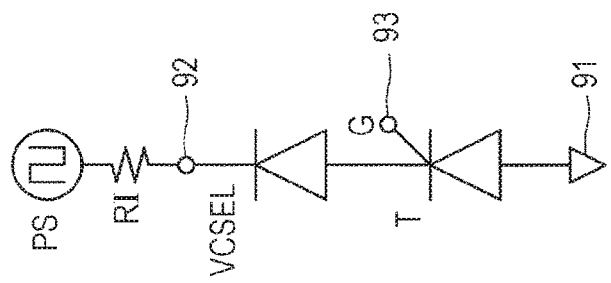
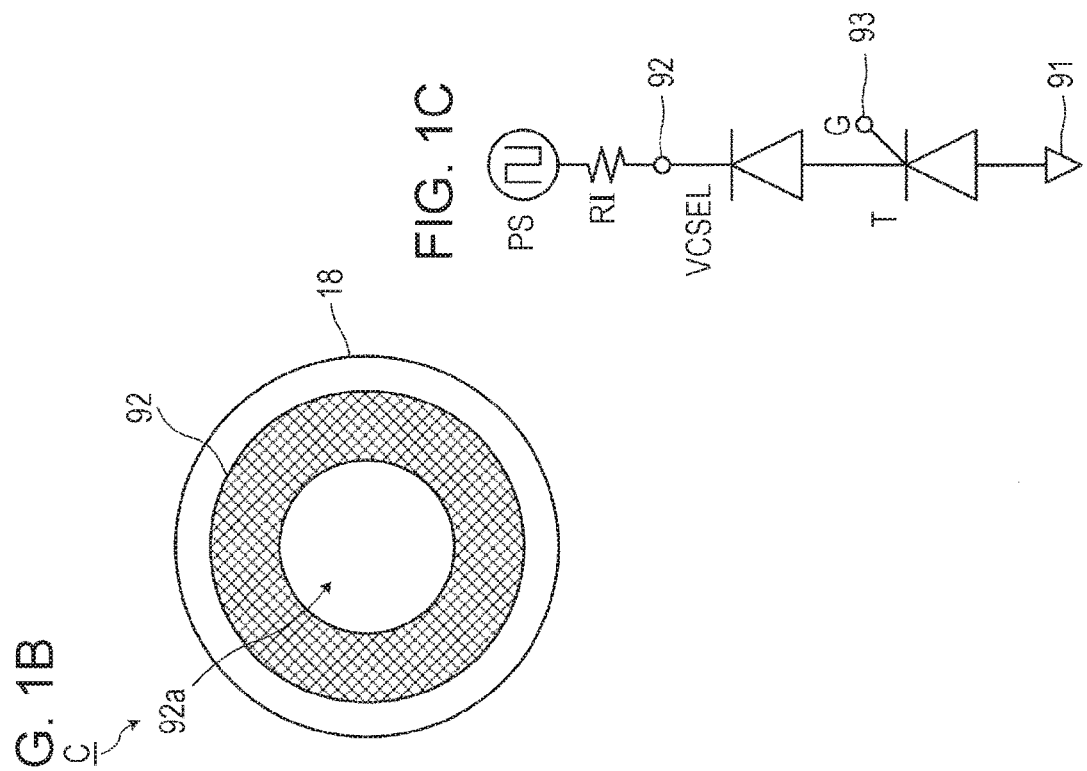
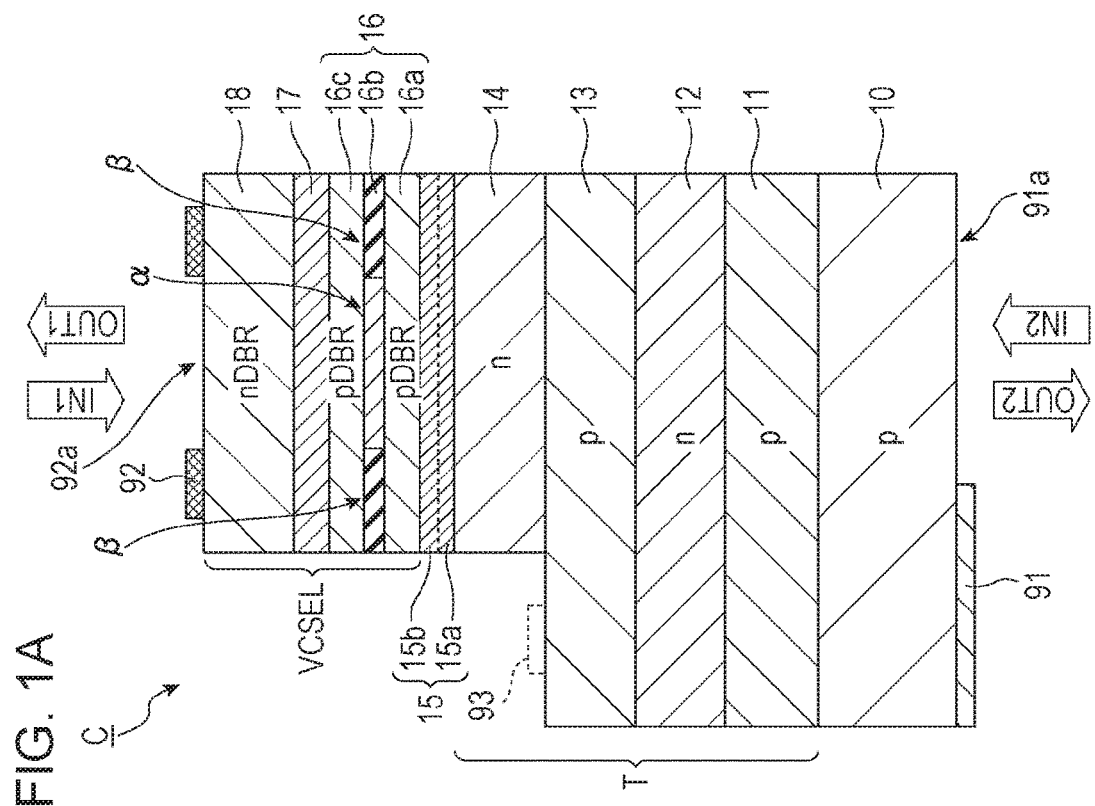

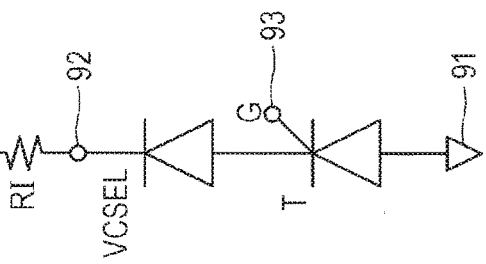
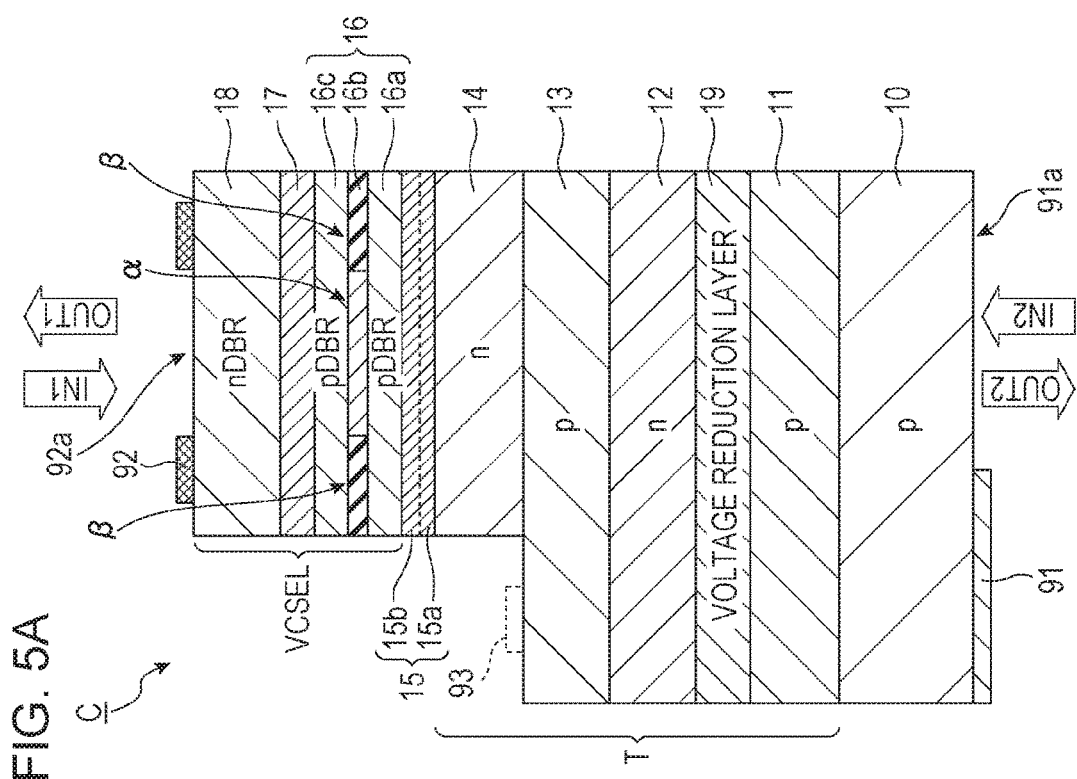

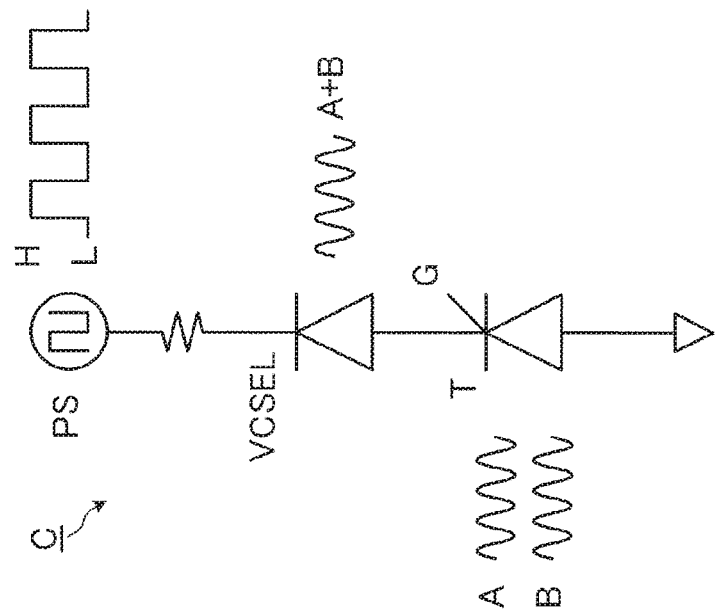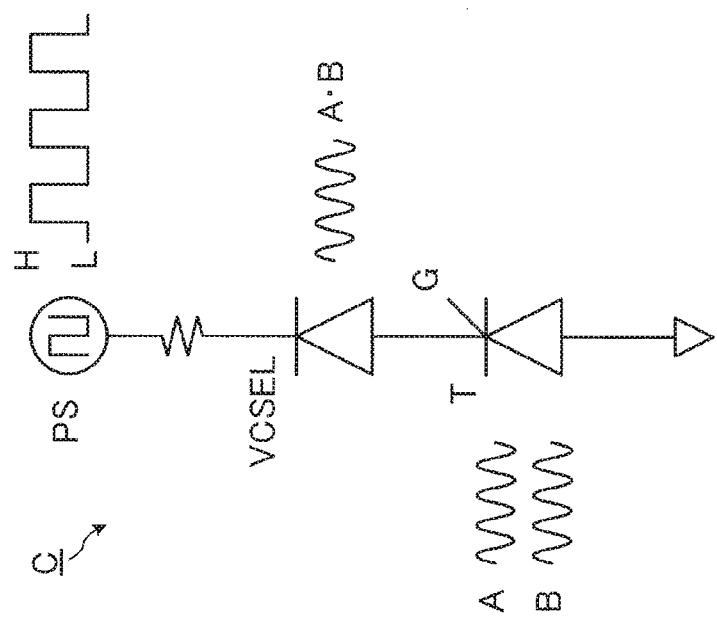

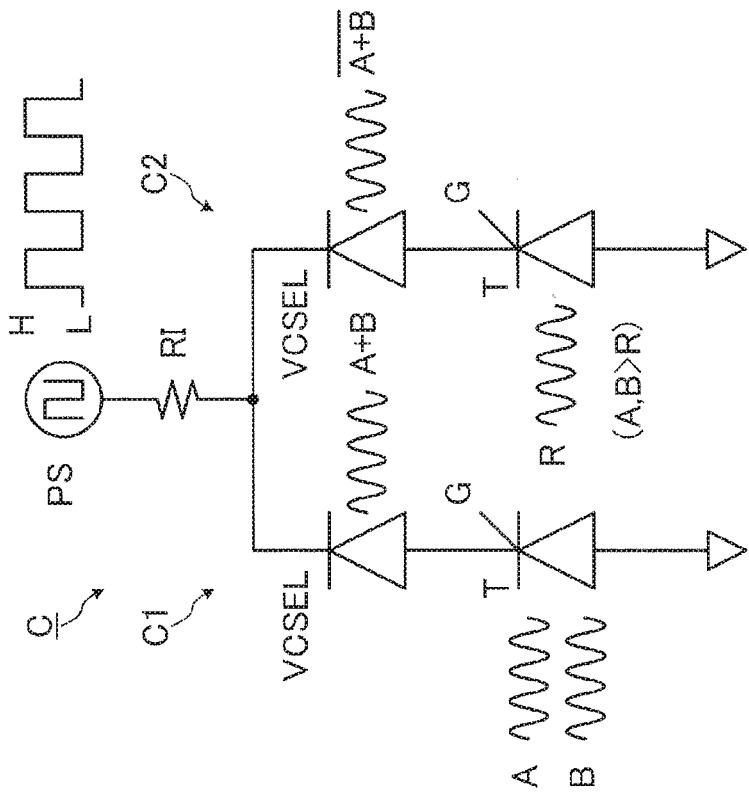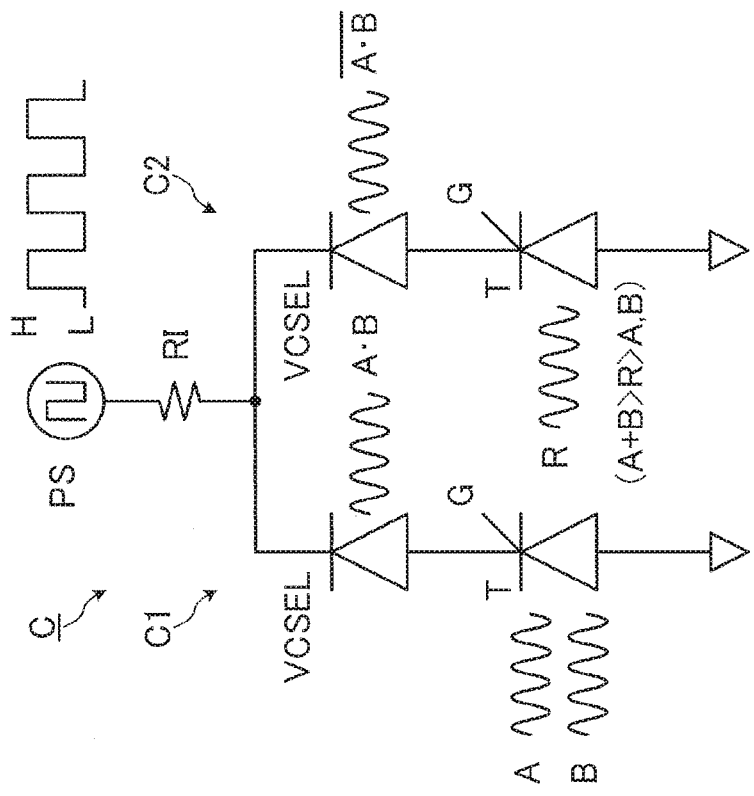

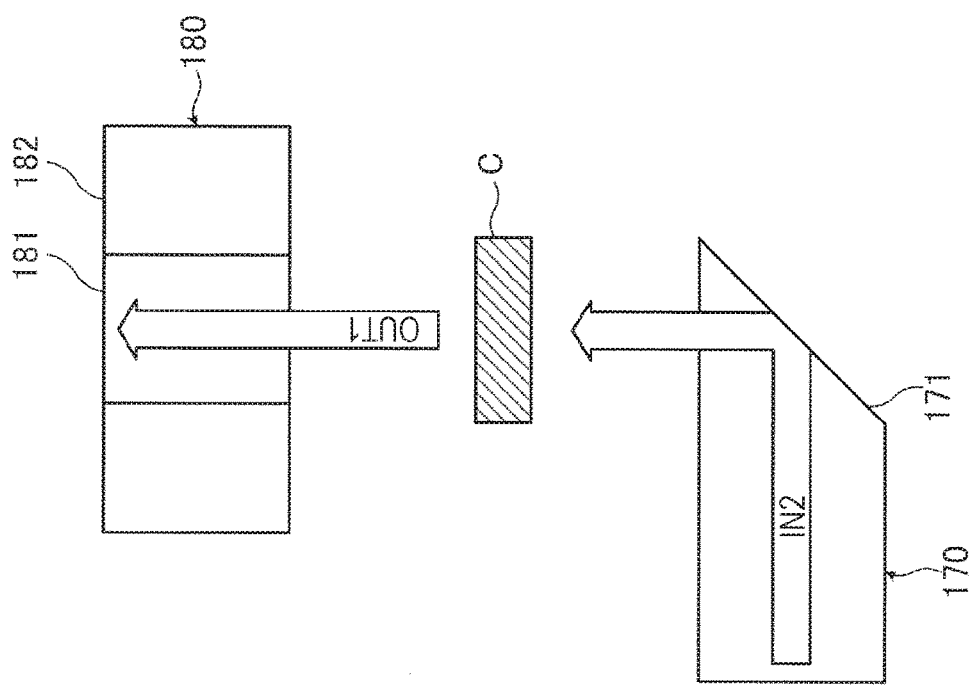
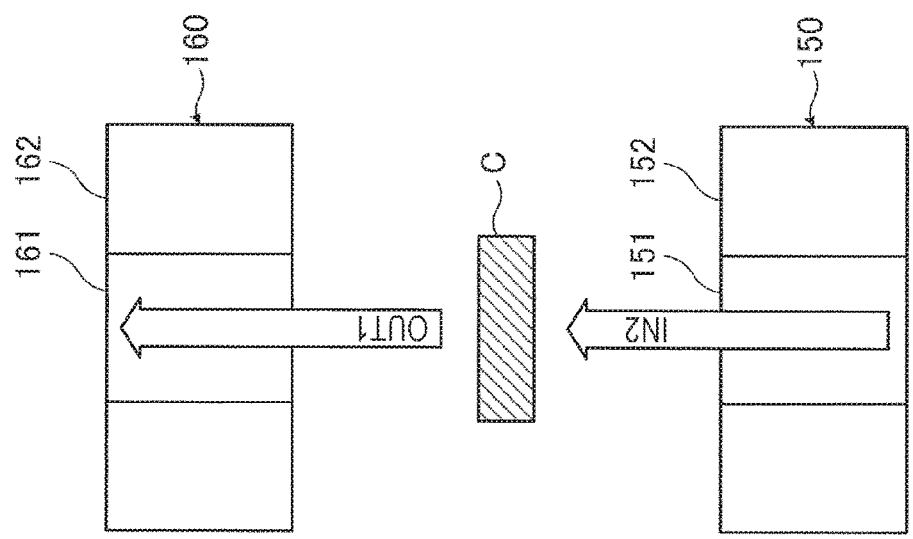

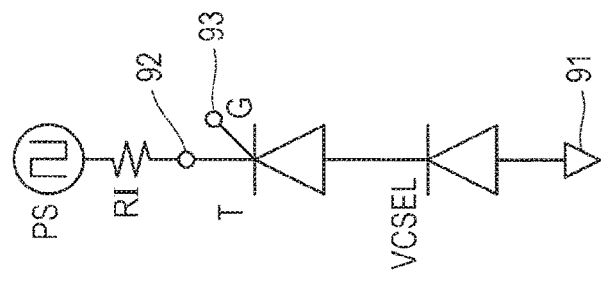
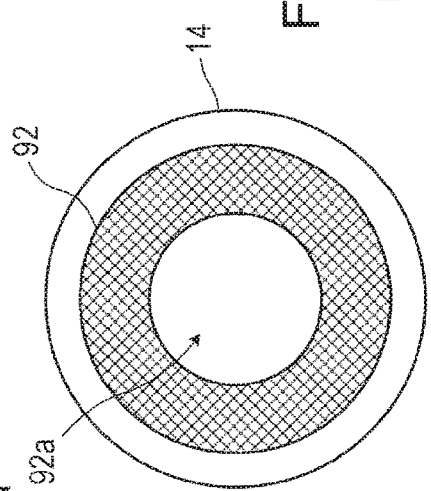
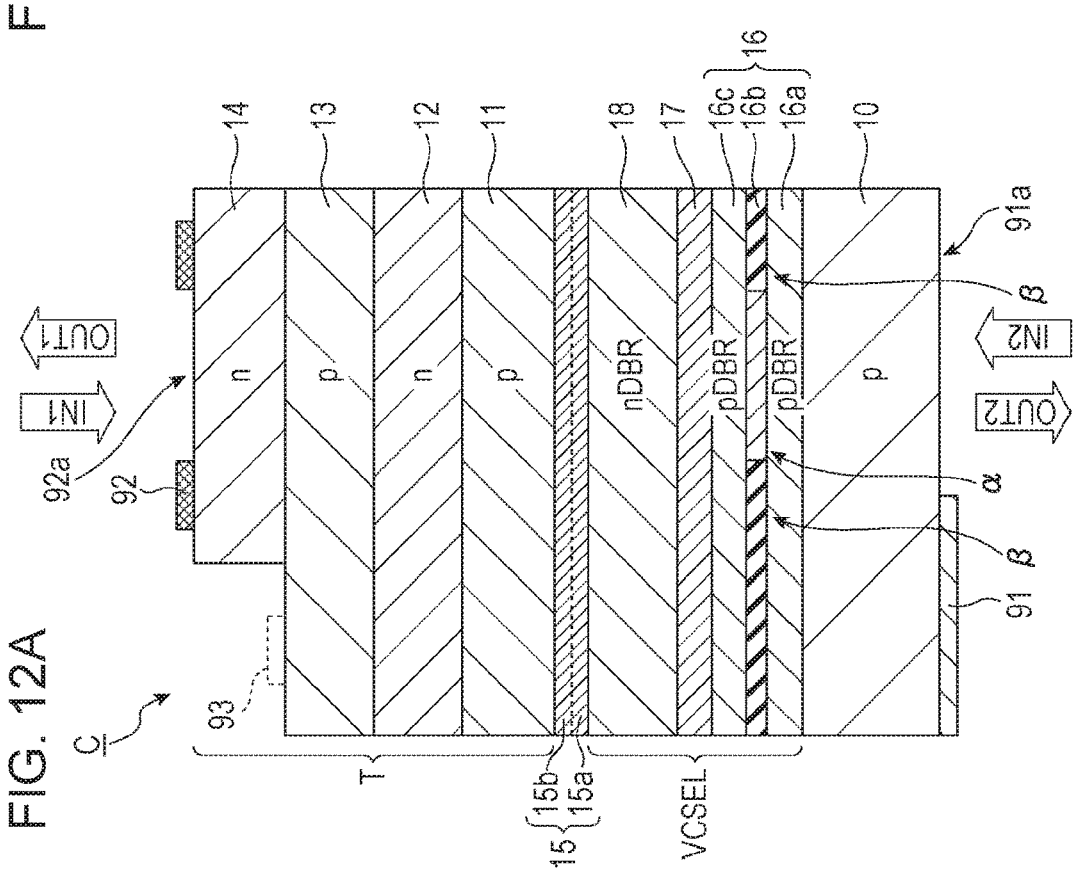

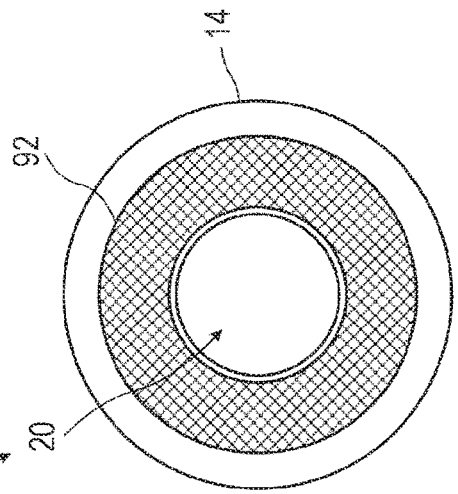
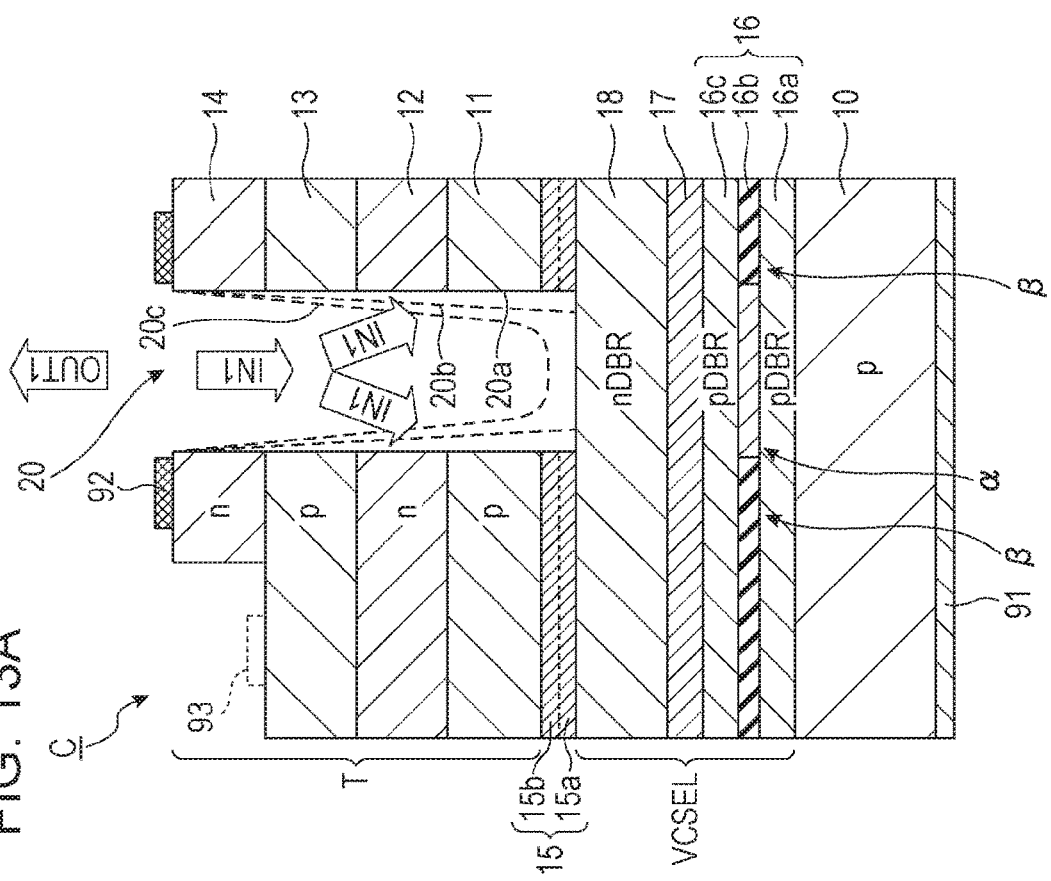
FIG. 13B
FIG. 13A

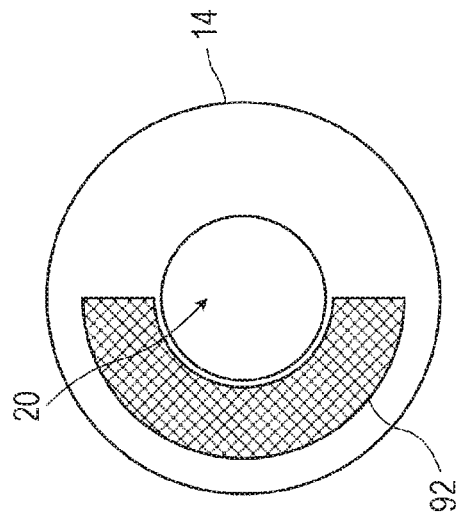
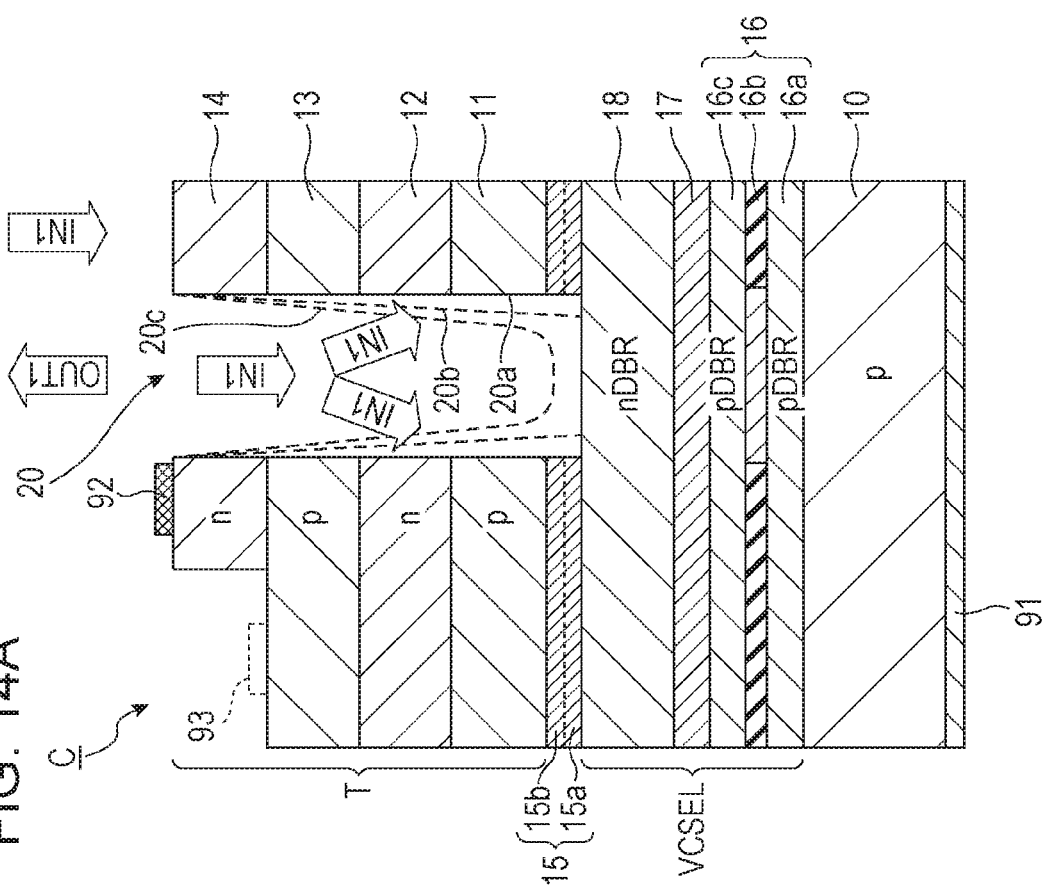

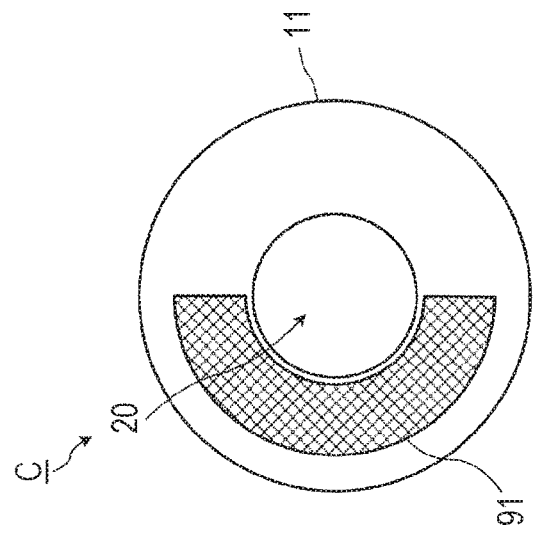
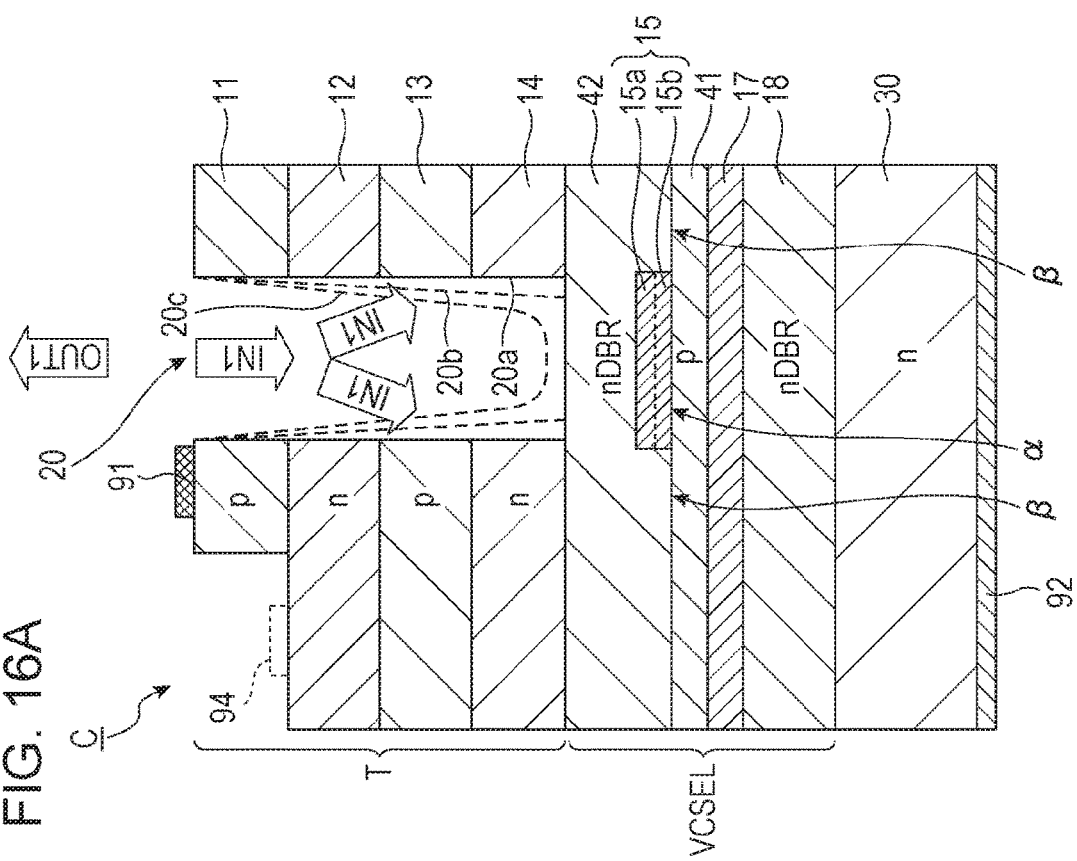

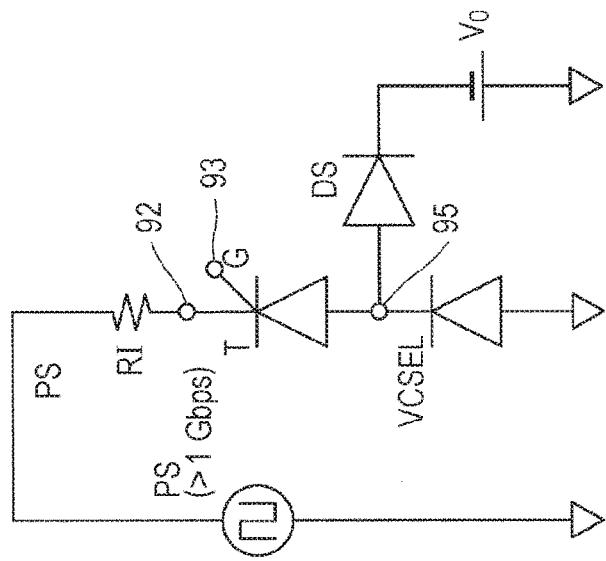
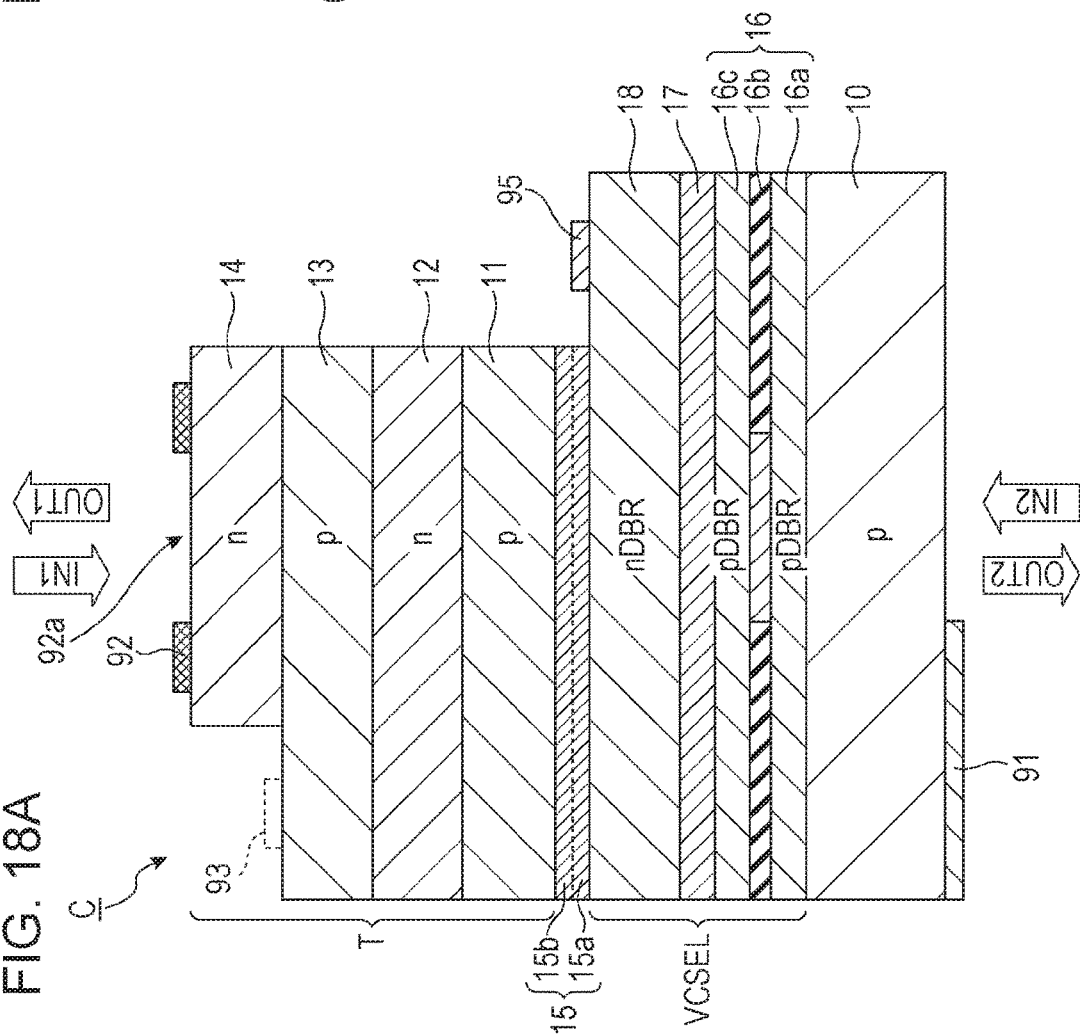

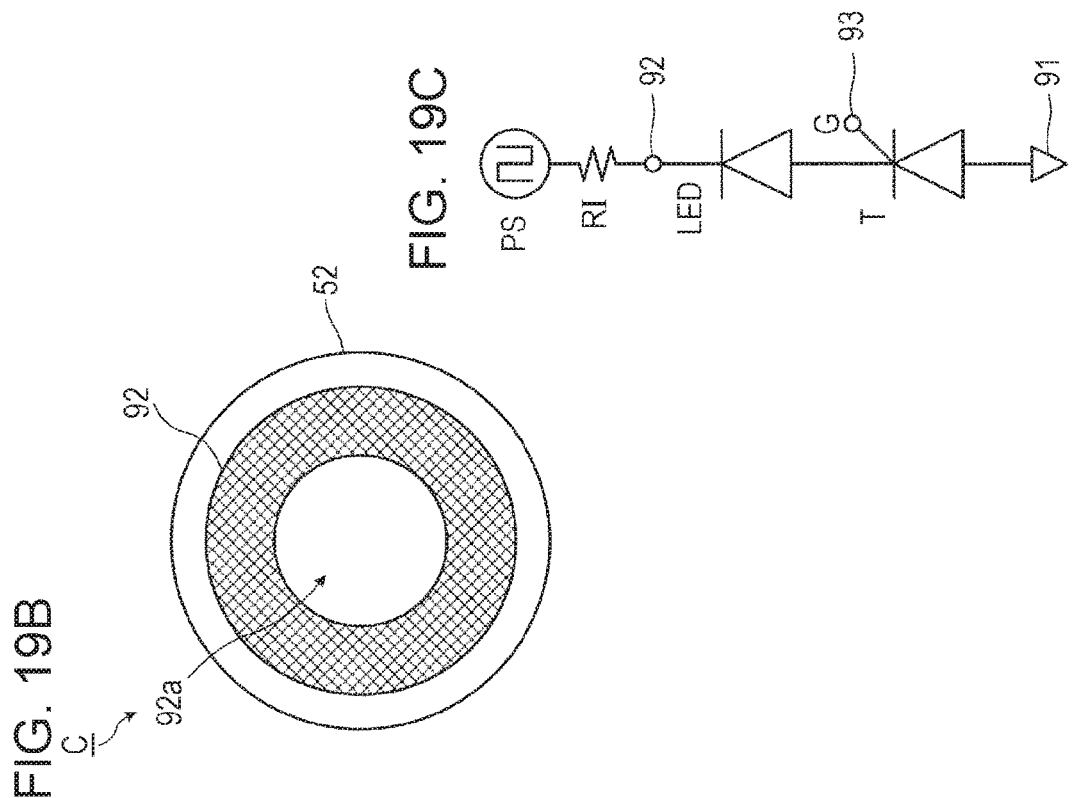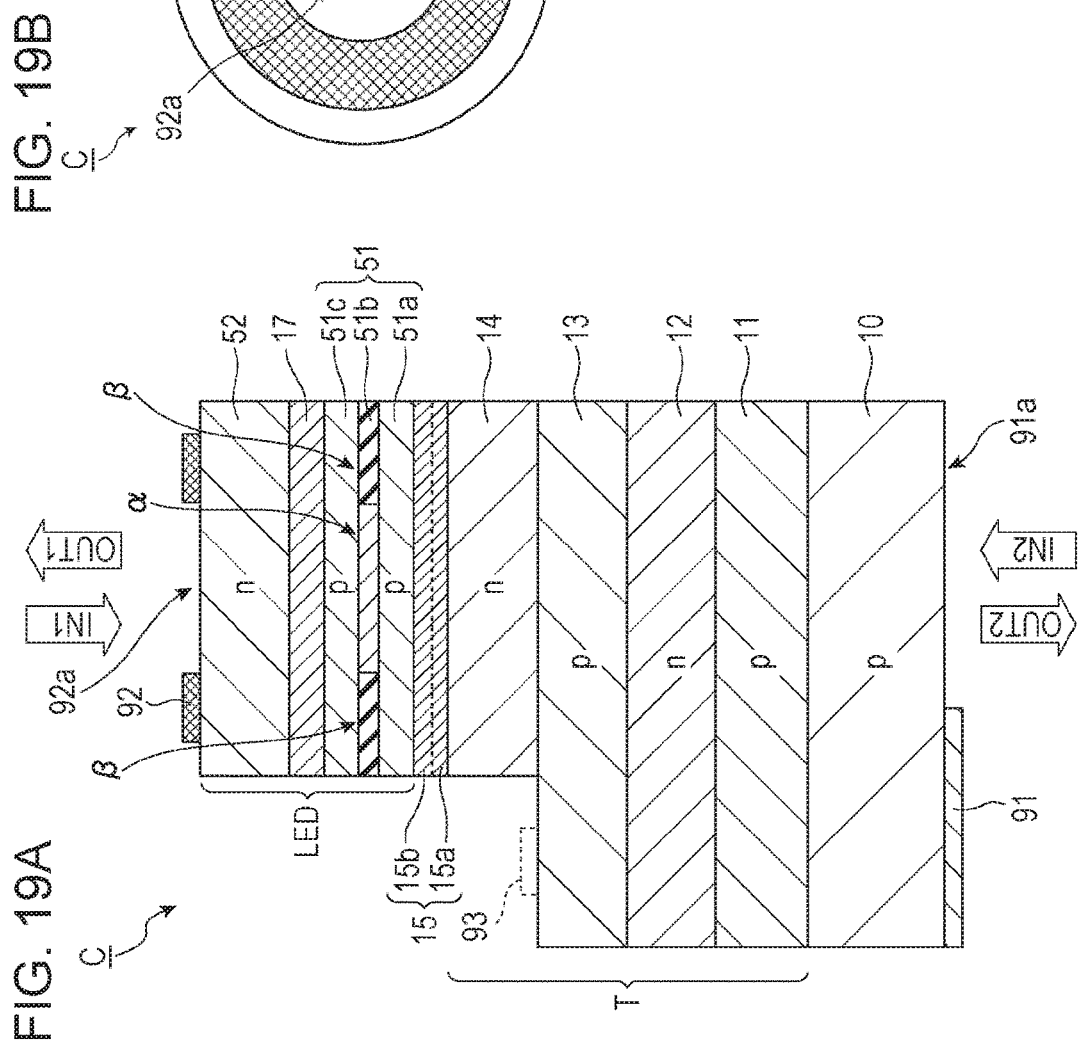

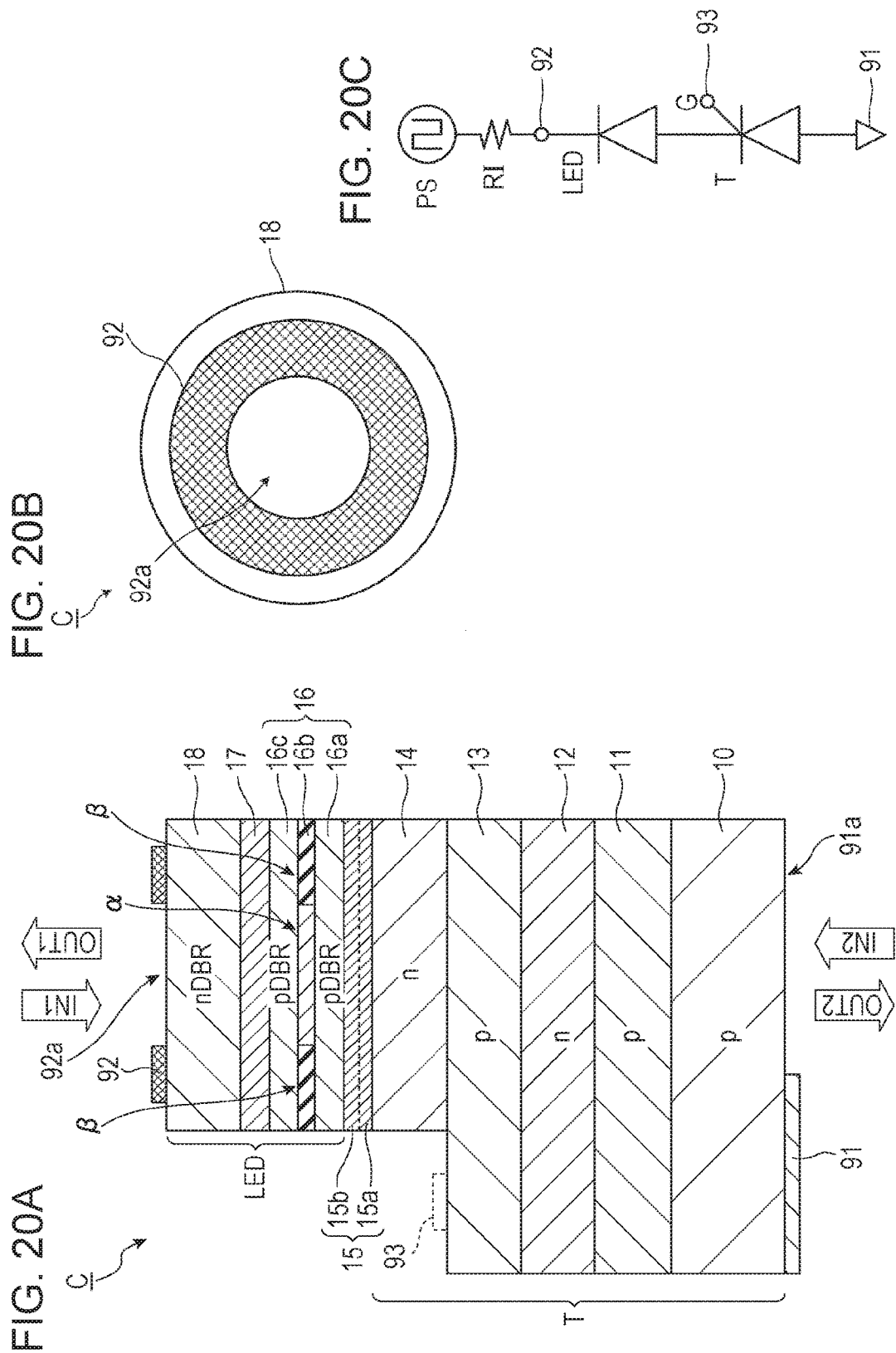

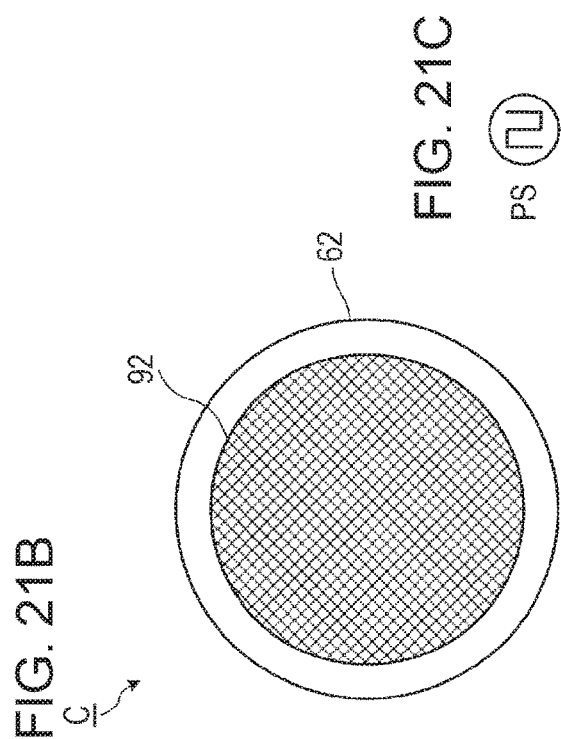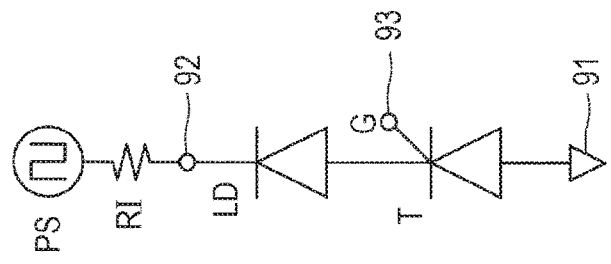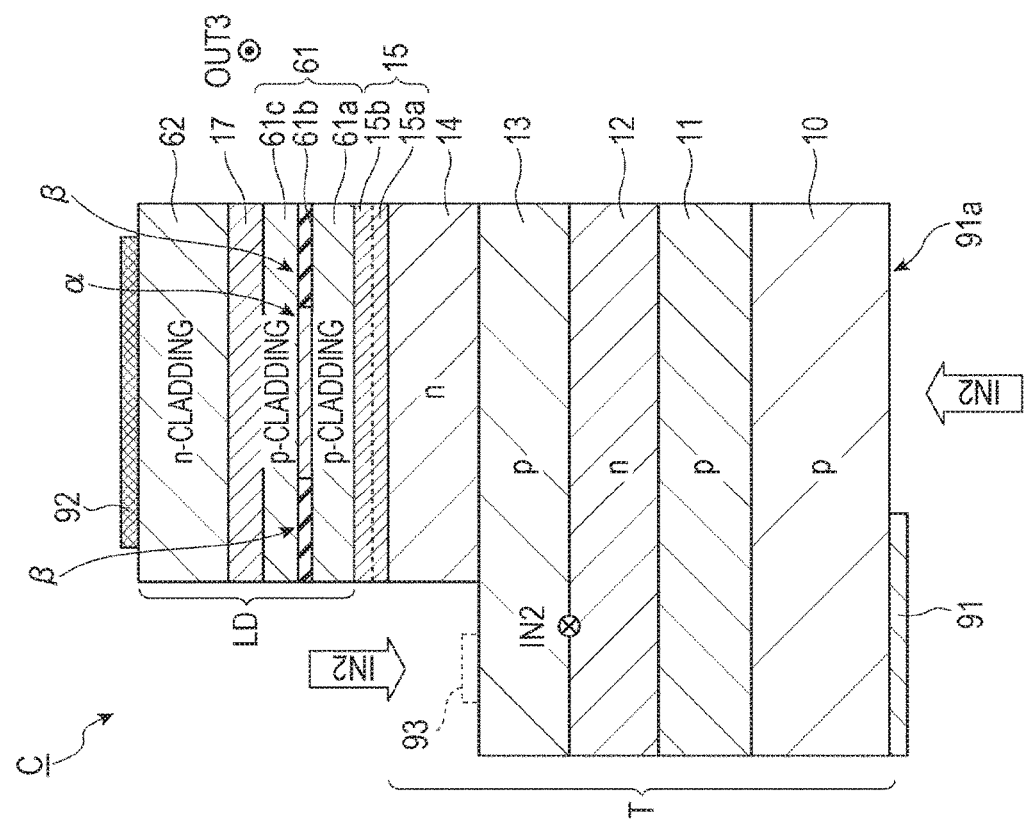

OPTICAL SWITCH

CROSS-REFERENCE TO RELATED APPLICATIONS

This application is based on and claims priority under 35 USC 119 from Japanese Patent Application No. 2016-129756 filed Jun. 30, 2016.

BACKGROUND

Technical Field

The present invention relates to an optical switch.

SUMMARY

According to an aspect of the invention, there is provided an optical switch including: a photothyristor that is switched from an off state to an on state by incident light; a light-emitting element that emits outgoing light when the photothyristor in the on state; and a tunnel junction layer or a III-V compound layer having metallic conductivity, the tunnel junction layer or the III-V compound layer being disposed between the photothyristor and the light-emitting element.

BRIEF DESCRIPTION OF THE DRAWINGS

Exemplary embodiments of the present invention will be described in detail based on the following figures, wherein:

FIG. 1A is a cross-sectional view illustrating an optical switch according to a first exemplary embodiment;

FIG. 1B is a top view of the optical switch;

FIG. 1C is an equivalent circuit of the optical switch;

FIG. 5A is a cross-sectional view illustrating an optical switch in which a vertical-cavity surface-emitting laser and a photothyristor including a voltage reduction layer are stacked;

FIG. 5B is a top view of the optical switch;

FIG. 5C is an equivalent circuit of the optical switch;

FIG. 8A illustrates a logical operation by the optical switch and shows a logical product (AND) circuit;

FIG. 8B shows a logical sum (OR) circuit;

FIG. 9A illustrates another logical operation by the optical switch and shows a negative logical product (NAND) circuit;

FIG. 9B shows a negative logical sum (NOR) circuit;

FIGS. 11A and 11B illustrate examples of coupling with the optical switch when light is incident on the rear surface of the optical switch and outgoing light is emitted from the front surface;

FIG. 12A is a cross-sectional view illustrating an optical switch according to a second exemplary embodiment;

FIG. 12B is a top view of the optical switch;

FIG. 12C is an equivalent circuit of the optical switch;

FIG. 13A is a cross-sectional view illustrating an optical switch according to a third exemplary embodiment;

FIG. 13B is a top view of the optical switch;

FIG. 14A is a cross-sectional view illustrating an optical switch according to a fourth exemplary embodiment;

FIG. 14B is a top view of the optical switch;

FIG. 16A is a cross-sectional view illustrating an optical switch according to a sixth exemplary embodiment;

FIG. 16B is a top view of the optical switch;

FIG. 18A is a cross-sectional view illustrating an optical switch according to an eighth exemplary embodiment;

FIG. 18B is an equivalent circuit of the optical switch;

FIG. 19A is a cross-sectional view illustrating an optical switch according to a ninth exemplary embodiment;

FIG. 19B is a top view of the optical switch;

FIG. 19C is an equivalent circuit of the optical switch;

FIG. 20A is a cross-sectional view illustrating an optical switch according to a tenth exemplary embodiment;

FIG. 20B is a top view of the optical switch;

FIG. 20C is an equivalent circuit of the optical switch;

FIG. 21A is a cross-sectional view illustrating an optical switch according to an eleventh exemplary embodiment;

FIG. 21B is a top view of the optical switch; and

FIG. 21C is an equivalent circuit of the optical switch.

DETAILED DESCRIPTION

Figure 2A:
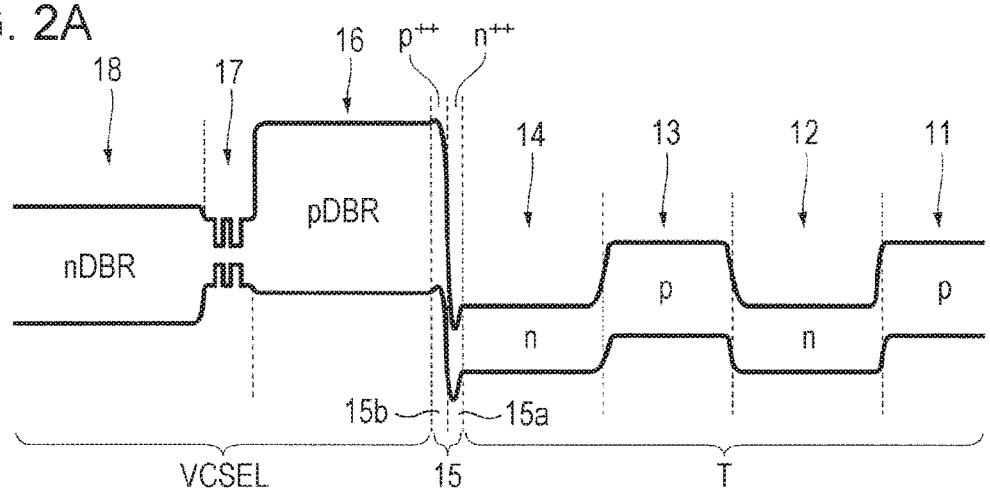
FIG. 2A illustrates a schematic energy band diagram of a layered structure including a photothyristor and a vertical-cavity surface-emitting laser.

The optical switch is a component that outputs light in response to light input. Specifically, the optical switch outputs an optical signal in response to optical signal input. Therefore, there is no need for conversion from an optical signal to an electric signal and conversion from an electric signal to an optical signal.

In order to perform signal processing using only optical signals instead of electric signals, there is a need for optical switches capable of logical operations such as logical product (AND) and logical sum (OR). There is also a need for optical switches with 3R functions including reamplification (Reamp), reshaping (Reshape), and retiming (Retime).

Referring next to the accompanying drawings, exemplary embodiments of the present invention will be described in detail.

In the following description, atomic symbols are used to represent elements. For example, aluminum is denoted by Al.

[First Exemplary Embodiment]
(Optical Switch C)

FIGS. 1A, 1B, and 1C illustrate an optical switch C according to a first exemplary embodiment. FIG. 1A is a cross-sectional view of the optical switch C, and FIG. 1B is a top view. FIG. 1C shows an equivalent circuit of the optical switch C.

The optical switch C described below includes a combination of a photothyristor T that is turned on in response to optical signal input (incident light) and a light-emitting element (e.g., a vertical-cavity surface-emitting laser (VCSEL)) that outputs an optical signal (outgoing light) when the photothyristor T is turned on.

The optical switch C is formed, for example, as an integrated circuit (IC) chip including compound semiconductor layers such as GaAs, GaAlAs, and AlAs layers that are monolithically (epitaxially) stacked on a substrate 10 such as a GaAs substrate.

Referring to FIG. 1A, a cross-sectional structure of the optical switch C will be described.

In the optical switch C, the photothyristor T and the VCSEL are stacked through a tunnel junction layer 15 described later and are electrically connected in series (VCSEL on Thyristor).

The optical switch C includes a p-type anode layer 11 (a p-anode layer 11) that functions as an anode of the photothyristor T, an n-type gate layer 12 (an n-gate layer 12) that functions as a gate, a p-type gate layer 13 (a p-gate layer 13) that functions as another gate, and an n-type cathode layer 14 (an n-cathode layer 14) that functions as a cathode, and these layers are stacked in this order on the p-type substrate 10 (the substrate 10). The photothyristor T has a pnpn four-layer structure composed of the p-anode layer 11, the n-gate layer 12, the p-gate layer 13, and the n-cathode layer 14. The photothyristor T will be described later in detail.

The tunnel junction (tunnel diode) layer 15 is disposed on the n-cathode layer 14. The tunnel junction layer 15 includes an $n^{++}$ layer 15a doped with an n-type impurity (dopant) at a high concentration and a $p^{++}$ layer 15b doped with a p-type impurity at a high concentration.

A distributed Bragg reflector layer (hereinafter referred to as a DBR layer) (a p-anode (DBR) layer 16) that functions as an anode of the VCSEL, a light-emitting layer 17, a DBR layer (an n-cathode (DBR) layer 18) that functions as a cathode of the VCSEL are disposed on the tunnel junction layer 15.

In the VCSEL, light resonates between the two DBR layers (the p-anode (DBR) layer 16 and the n-cathode (DBR) layer 18) to cause laser oscillation to occur. Specifically, laser oscillation occurs when the reflectivity of the two DBR layers (the p-anode (DBR) layer 16 and the n-cathode (DBR) layer 18) is, for example, 99% or more. The light is emitted in a direction perpendicular to the light-emitting layer 17.

In the following description, the terms above in parentheses are used for their respective components. These terms correspond to the respective functions of the photothyristor T and the VCSEL. The same applies to other components. For each layer in drawings such as FIG. 1A, the conduction type of impurity is primarily shown, and "DBR" is added when the layer is a DBR layer.

The p-anode (DBR) layer 16 includes a current confining layer 16b. Specifically, the p-anode (DBR) layer 16 includes a lower p-anode layer 16a, the current confining layer 16b, and an upper p-anode layer 16c that are stacked in this order, and the lower p-anode layer 16a and the upper p-anode layer 16c serve as DBR layers. In the following description, the lower p-anode layer 16a and the upper p-anode layer 16c are denoted as a lower p-anode (DBR) layer 16a and an upper p-anode (DBR) layer 16c, respectively.

The current confining layer 16b is provided to concentrate a current flowing though the VCSEL in its central portion. Specifically, the circumferential portion of the VCSEL has many defects caused by mesa etching performed to separate the optical switch C. Therefore, non-radiative recombination is more likely to occur in the circumferential portion. The current confining layer 16b is disposed such that a current-flowing portion (region) α through which the current easily flows is formed in the central portion of the VCSEL and that a current-blocking portion (region) β through which the current less easily flows is formed in the circumferential portion of the VCSEL.

An anode electrode 91 is provided on the rear surface of the substrate 10. A cathode electrode 92 is provided on the n-cathode (DBR) layer 18.

In the photothyristor T, a control electrode 93 serving as a gate G for controlling the turn-on characteristics of the photothyristor T is provided on an exposed portion of the p-gate layer 13. The control electrode 93 may be provided on an exposed portion of the n-gate layer 12. The control electrode 93 may not be provided. Therefore, the control electrode 93 is represented by a broken line in FIG. 1A. In the following description, the control electrode 93 is not shown.

The anode electrode 91 and the control electrode 93 are formed from a material that forms an ohmic contact with a p-type semiconductor, and the cathode electrode 92 is formed from a material that forms an ohmic contact with an n-type semiconductor.

In FIG. 1A, incoming light IN1, incoming light IN2, outgoing light OUT1, and outgoing light OUT2 are shown. When the incoming light IN1 and the incoming light IN2 are not distinguished from each other, they are denoted simply as incoming light. When the outgoing light OUT1 and the outgoing light OUT2 are not distinguished from each other, they are denoted simply as outgoing light.

The incoming light IN1 and the incoming light IN2 need to be absorbed by the photothyristor T.

The incoming light IN1 is incident on the VCSEL, passes through the VCSEL, and reaches the photothyristor T. In this case, it is necessary that the semiconductors forming the VCSEL do not absorb the incoming light IN1, i.e., be transparent (have a large band gap).

The incoming light IN2 is incident on the substrate 10. It is therefore necessary that the substrate 10 do no attenuate the incoming light IN2 (absorb less incoming light IN2), i.e., be transparent.

The outgoing light OUT1 is emitted from the VCSEL side. Therefore, the outgoing light OUT1 may be absorbable by the photothyristor T.

The outgoing light OUT2 is emitted through the photothyristor T and the substrate 10. Therefore, it is necessary that the photothyristor T and the substrate 10 do no absorb the outgoing light OUT2, i.e., be transparent to the outgoing light OUT2 (have a large band gap).

When a combination of the incoming light IN2 and the outgoing light OUT1 is used, the incoming light and the outgoing light may have the same wavelength. However, when a combination of the incoming light IN1 and the outgoing light OUT2, a combination of the incoming light IN1 and the outgoing light OUT1, or a combination of the incoming light IN2 and the outgoing light OUT2 is used, the wavelength of the incoming light differs from the wavelength of the outgoing light.

When a combination of the incoming light IN1 and the outgoing light OUT1 is used, the anode electrode 91 may be disposed over the entire rear surface of the substrate 10. In other cases, to prevent the input of the incoming light IN2 or the output of the outgoing light OUT2 from being blocked, an input-output section 91a in which no anode electrode 91 is disposed is provided.

Referring next to FIG. 1B, the upper surface of the optical switch C will be described.

As described above, the optical switch C has been separated by mesa etching. Specifically, the VCSEL has been mesa-etched so as to have, for example, a circular cross-section. The cathode electrode 92 having an annular shape is disposed on the n-cathode (DBR) layer 18. The inner side of the annular cathode electrode 92 is an input-output section 92a through which the incoming light IN1 is inputted and the outgoing light OUT1 is outputted.

In FIG. 1A, since the control electrode 93 is disposed, the cross-sectional shape of the photothyristor T differs from the cross-sectional shape of the VCSEL. When the control electrode 93 is not provided, the cross-sectional shape of the photothyristor T may be the same as the cross-sectional shape of the VCSEL.

The cross-sectional shapes may be any other shape such as a quadrangular shape.

Referring to FIG. 1C, the equivalent circuit of the optical switch C will be described.

The optical switch C is formed by stacking the photothyristor T and the VCSEL one on another.

In the optical switch C, the anode electrode 91 is grounded, and the cathode electrode 92 is connected to a power source PS through a current-limiting resistor RI. The tunnel junction layer 15 is omitted because it does not impede the flow of electric current from the photothyristor T to the VCSEL, as described later.

As shown in FIG. 1C, the photothyristor T and the VCSEL are electrically connected in series. No voltage is applied to the control electrode 93 of the photothyristor T. A voltage (gate voltage) may be applied to the control electrode 93 of the photothyristor T, as described later.

The equivalent circuit shown in FIG. 1C has a common anode.

The operation of the optical switch C will be described. First, the tunnel junction layer 15 will be described.

<Tunnel Junction Layer 15>

Figure 2B:
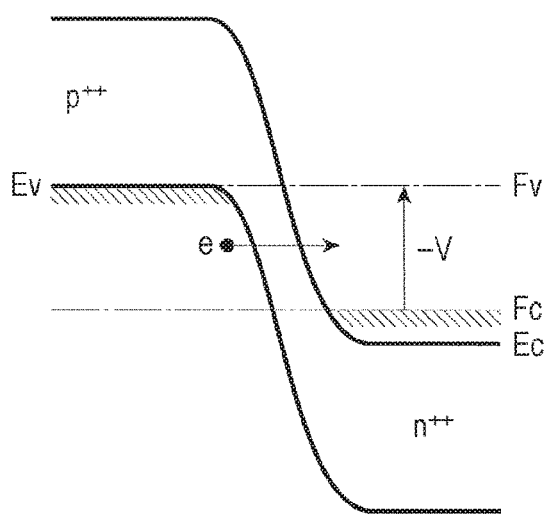
FIG. 2B shows an energy band diagram when a tunnel junction layer is in a reverse biased state.
Figure 2C:
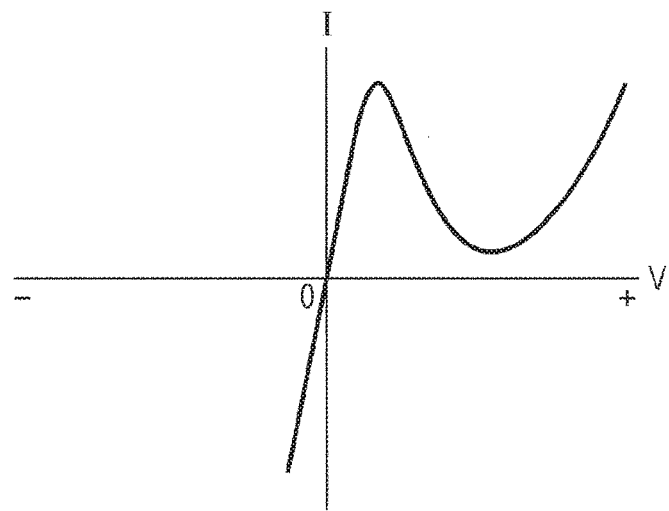
FIG. 2C shows the current-voltage characteristics of the tunnel junction layer.

FIGS. 2A, 2B, and 2C give further description of the layered structure of the photothyristor T and the VCSEL. FIG. 2A is a schematic energy band diagram of the layered structure of the photothyristor T and the VCSEL. FIG. 2B is an energy band diagram of the tunnel junction layer 15 in a reverse biased state, and FIG. 2C shows the current-voltage characteristics of the tunnel junction layer 15.

As shown in the energy band diagram in FIG. 2A, the photothyristor T has the pnpn four-layer structure including the p-anode layer 11, the n-gate layer 12, the p-gate layer 13, and the n-cathode layer 14. The VCSEL has a structure including the n-cathode (DBR) layer 18, the light-emitting layer 17, and the p-anode (DBR) layer 16. The tunnel junction layer 15 is disposed between the photothyristor T and the VCSEL. The tunnel junction layer 15 has a structure including the $n^{++}$ layer 15a and the $p^{++}$ layer 15b.

When a voltage is applied such that the anode electrode 91 in FIG. 1A is positive and the cathode electrode 92 is negative, the junction between the $n^{++}$ layer 15a and the $p^{++}$ layer 15b in the tunnel junction layer 15 and the junction between the n-gate layer 12 and the p-gate layer 13 in the photothyristor T are reverse biased, as shown in FIG. 2A.

The tunnel junction layer 15 includes the junction between the $n^{++}$ layer 15a doped with an n-type impurity at a high concentration and the $p^{++}$ layer 15b doped with a p-type impurity at a high concentration. Therefore, the width of the depletion region is small. When the tunnel junction layer 15 is forward biased (+V), electrons tunnel from the conduction band on the $n^{++}$ layer 15a side to the valence band on the $p^{++}$ layer 15b side. In this case, the tunnel junction layer 15 exhibits negative resistance characteristics (see FIG. 2C).

As shown in FIG. 2B, when the tunnel junction layer 15 (tunnel junction) is reverse biased (−V), the potential Ev of the valence band on the $p^{++}$ layer 15b side is higher than the potential Ec of the conduction band on the $n^{++}$ layer 15a side. Then electrons tunnel from the valence band of the $p^{++}$ layer 15b to the conduction band on the $n^{++}$ layer 15a side. As the absolute value of the reverse bias voltage (−V) increases, electrons can more easily tunnel. Specifically, as shown in FIG. 2C, a current easily flows through the tunnel junction layer 15 (tunnel junction) even when it is reverse biased.

Therefore, when the optical switch C is in an on state, a current easily flows from the photothyristor T to the VCSEL although the tunnel junction layer 15 is reverse biased.

When the tunnel junction layer 15 is not provided, the junction between the photothyristor T and the VCSEL is reverse biased. Therefore, to allow a current to flow through the photothyristor T and the VCSEL, a voltage that causes breakdown of the reverse biased junction is applied. This causes an increase in driving voltage.

However, when the photothyristor T and the VCSEL are stacked through the tunnel junction layer 15, the voltage applied to the optical switch C can be lower than that when the tunnel junction layer 15 is not provided.

<Photothyristor T>

Next, the operation of the photothyristor T will be described.

Referring to FIG. 1A, the photothyristor T will be focused and described.

As described above, the photothyristor T includes the p-type semiconductor layers (the p-anode layer 11 and the p-gate layer 13) and the n-type semiconductor layers (the n-gate layer 12 and the n-cathode layer 14) that are formed of, for example, GaAs, AlGaAs, or AlAs, and the forward potential (diffusion potential) Vd of junctions between the p-type semiconductor layers and the n-type semiconductor layers (p-n junctions) is, for example, 1.5 V.

When a voltage is applied to the photothyristor T such that the anode (the p-anode layer 11) is positive and the cathode (the n-cathode layer 14) is negative, the junction between the p-anode layer 11 and the n-gate layer 12 and the junction between the p-gate layer 13 and the n-cathode layer 14 are forward biased, and the junction between the n-gate layer 12 and the p-gate layer 13 is reverse biased. Specifically, a depletion layer is formed between the n-gate layer 12 and the p-gate layer 13.

When the photothyristor T in this state is irradiated with light (incoming light) having a wavelength that is absorbed by semiconductor materials included in the photothyristor T, electric charges are generated in the depletion layer. Then a bipolar transistor composed of the p-anode layer 11, the n-gate layer 12, and the p-gate layer 13 and a bipolar transistor composed of the n-gate layer 12, the p-gate layer 13, and the n-cathode layer 14 are switched to the on state. In this manner, all the junctions including the junction between the n-gate layer 12 and the p-gate layer 13 are forward biased, and the current continues to flow, i.e., the photothyristor T is switched from the off state to the on state (turned on).

In this state, the voltage between the anode and cathode of the photothyristor T is approximately the same as the forward potential Vd (1.5 V) of one p-n junction. The voltage between the anode and cathode of the photothyristor T is determined by the current flowing between the anode and cathode of the photothyristor T. Specifically, the voltage is determined by the current-limiting resistor RI etc. In the following description, the voltage between the anode and cathode of the photothyristor T in the on state is assumed to be 1.5 V.

To switch the photothyristor T from the on state to the off state (to turn off the photothyristor T), the voltage between the anode and cathode of the photothyristor T is reduced such that the on state cannot be maintained, i.e., reduced to a value lower than the forward potential Vd (1.5 V) (including 0 V and a reverse polarity voltage).

When a voltage is applied to the control electrode 93, the size of the depletion layer formed at the junction between the n-gate layer 12 and the p-gate layer 13 is controlled. Specifically, when a voltage is applied to the control electrode 93, the amount of incoming light necessary to turn on the photothyristor T is reduced as compared with that when no voltage is applied. The amount of incoming light at which the photothyristor T is turned on may be controlled by controlling the voltage applied to the control electrode 93.

The n-gate layer 12 may be exposed, and a control electrode may be provided on the exposed portion of the n-gate layer 12, as described above.

<Operation of Optical Switch C>

The operation of the optical switch C will next be described.

For example, the voltage necessary for the VCSEL to emit light (outgoing light) is assumed to be 1.7 V. It is also assumed that the power source PS supplies 3.2 V which is the sum of 1.7 V and the forward potential Vd (1.5 V) of the photothyristor T.

In the state in which the photothyristor T is not turned on (in the off state), most of the applied voltage is applied to the reverse biased junction of the photothyristor T (the junction between the n-gate layer 12 and the p-gate layer 13). Therefore, the VCSEL does not emit light (outgoing light).

When the photothyristor T is turned on by incoming light, the voltage between the anode and cathode of the photothyristor T becomes 1.5 V. Then 1.7 V is applied to the VCSEL. The VCSEL thereby emits light (outgoing light).

The voltages described above are examples, and the voltages applied may be set according to the characteristics of the optical switch C.

<Method for Producing Optical Switch C>

Figure 3A:
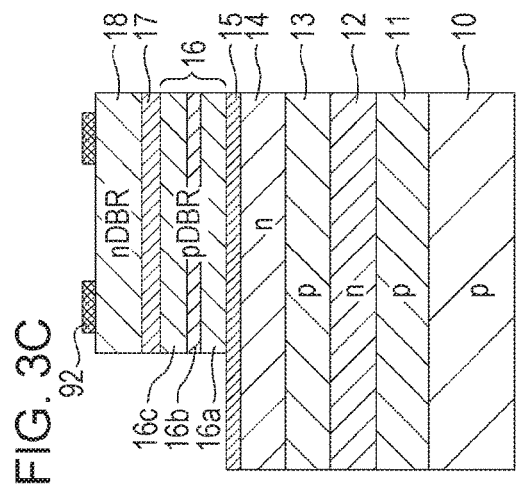
FIG. 3A illustrates a semiconductor stack forming step in an optical switch production method.
Figure 3B:
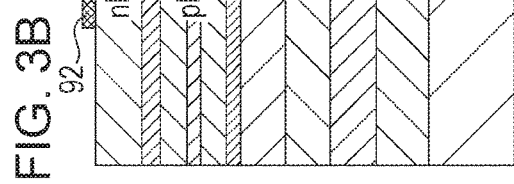
FIG. 3B illustrates a cathode electrode forming step.
Figure 3C:
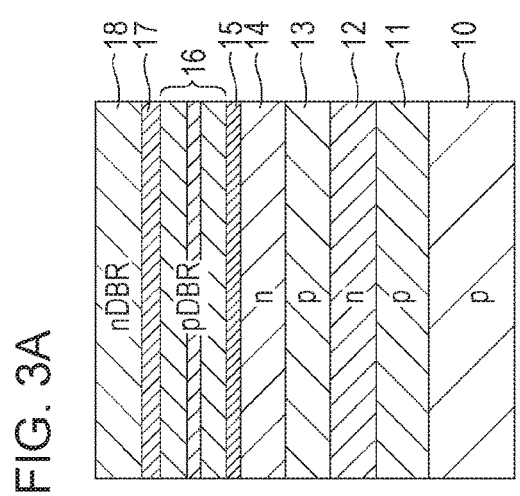
FIG. 3C illustrates an etching step for exposing the tunnel junction layer.
Figure 3D:
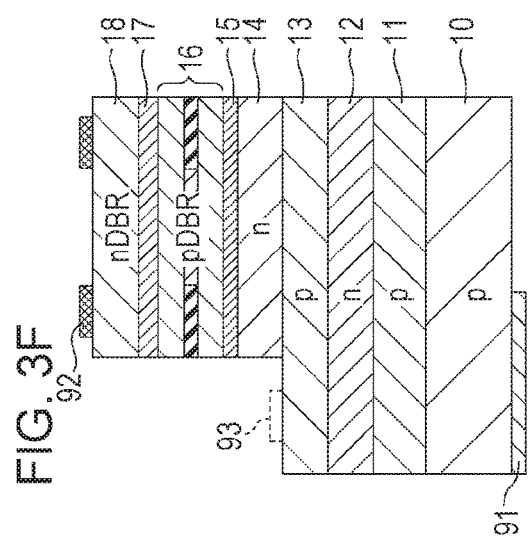
FIG. 3D illustrates the step of forming a current-blocking portion in a current confining layer.
Figure 3E:
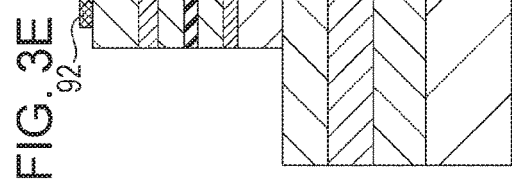
FIG. 3E illustrates an etching step for exposing a p-gate layer.
Figure 3F:
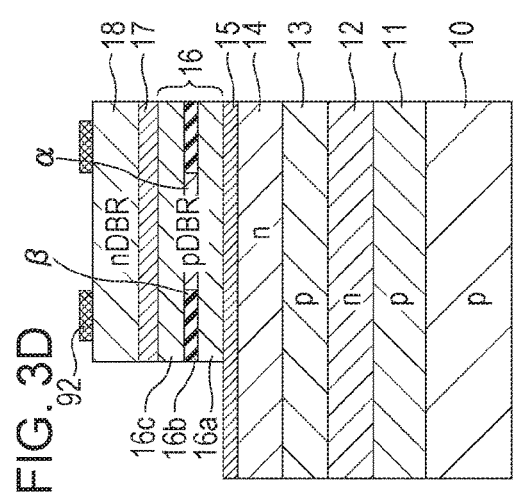
FIG. 3F illustrates an anode electrode forming step.

FIGS. 3A to 3F illustrate a method for producing the optical switch C. FIG. 3A illustrates a semiconductor stack forming step, and FIG. 3B illustrates a step of forming the cathode electrode 92. FIG. 3C illustrates an etching step for exposing the tunnel junction layer 15, and FIG. 3D illustrates a step of forming the current-blocking portion β in the current confining layer 16b. FIG. 3E illustrates an etching step for exposing the p-gate layer 13, and FIG. 3F illustrates a step of forming the anode electrode 91.

In FIGS. 3A to 3F, plural steps may be collectively shown. These steps will be described one by one.

In the semiconductor stack forming step shown in FIG. 3A, the p-anode layer 11, the n-gate layer 12, the p-gate layer 13, the n-cathode layer 14, the tunnel junction layer 15, the p-anode (DBR) layer 16, the light-emitting layer 17, and the n-cathode (DBR) layer 18 are epitaxially formed in this order on the p-type substrate 10 to thereby form a semiconductor stack. The p-anode (DBR) layer 16 includes the lower p-anode (DBR) layer 16a, the current confining layer 16b, and the upper p-anode (DBR) layer 16c.

In the example described below, the substrate 10 is p-type GaAs but may be n-type GaAs or intrinsic (i) GaAs undoped with impurities. The substrate 10 may be formed of InP, GaN, InAs, sapphire, Si, etc. When the substrate is changed, a material with a lattice constant that approximately conforms to the lattice constant of the substrate is used as the material monolithically stacked on the substrate (a strain structure or a strain relaxation layer may be formed, or metamorphic growth may be used). For example, InAs, InAsSb, GaInAsSb, etc. is used for an InAs substrate, and InP, InGaAsP, etc. is used for an InP substrate. GaN, AlGaN, or InGaN is used for a GaN substrate or a sapphire substrate, and Si, SiGe, GaP, etc. is used for a Si substrate. When the semiconductor stack is applied to a different support substrate after crystal growth, it is unnecessary that the semiconductor material be approximately lattice-matched with the support substrate.

The p-anode layer 11 is, for example, p-type $Al_{0.9}GaAs$ with an impurity concentration of $1\times10^{18}/cm^3$. The content of Al may be changed within the range of 0 to 1. The p-anode layer 11 may be, for example, GaInP.

The n-gate layer 12 is, for example, n-type $Al_{0.9}GaAs$ with an impurity concentration of $1\times10^{17}/cm^3$. The content of Al may be changed within the range of 0 to 1. The n-gate layer 12 may be, for example, GaInP.

The p-gate layer 13 is, for example, p-type $Al_{0.9}GaAs$ with an impurity concentration of $1\times10^{17}/cm^3$. The content of Al may be changed within the range of 0 to 1. The p-gate layer 13 may be, for example, GaInP.

The n-cathode layer 14 is, for example, n-type $Al_{0.9}GaAs$ with an impurity concentration of $1\times10^{18}/cm^3$. The content of Al may be changed within the range of 0 to 1. The n-cathode layer 14 may be, for example, GaInP.

The tunnel junction layer 15 includes the junction between the $n^{++}$ layer 15a doped with an n-type impurity at a high concentration and the $p^{++}$ layer 15b doped with a p-type impurity at a high concentration (see FIG. 1A). In each of the $n^{++}$ layer 15a and the $p^{++}$ layer 15b, the impurity concentration is high, e.g., $1\times10^{20}/cm^3$. In an ordinary junction, the impurity concentration is of the order of $10^{17}/cm^3$ to $10^{18}/cm^3$. The combination of the $n^{++}$ layer 15a and the $p^{++}$ layer 15b (hereinafter denoted by the $n^{++}$ layer 15a/the $p^{++}$ layer 15b) is, for example, $n^{++}$ GaInP/$p^{++}$ GaAs, $n^{++}$ GaInP/$p^{++}$ AlGaAs, $n^{++}$ GaAs/$p^{++}$ GaAs, $n^{++}$ AlGaAs/$p^{++}$ AlGaAs, $n^{++}$ InGaAs/$p^{++}$ InGaAs, $n^{++}$ GaInAsP/$p^{++}$ GaInAsP, or $n^{++}$ GaAsSb/$p^{++}$ GaAsSb. The materials in the combinations may be mutually exchanged.

The p-anode (DBR) layer 16 includes the lower p-anode (DBR) layer 16a, the current confining layer 16b, and the upper p-anode (DBR) layer 16c that are stacked in this order.

Each of the lower p-anode (DBR) layer 16a and the upper p-anode (DBR) layer 16c includes a combination of high-Al content low-refractive index layers of p-type $Al_{0.9}Ga_{0.1}As$ with an impurity concentration of, for example, $1\times10^{18}/cm^3$ and low-Al content high-refractive index layers of p-type $Al_{0.2}Ga_{0.8}As$ with an impurity concentration of, for example, $1\times10^{18}/cm^3$. The thickness (optical path length) of each of the low-refractive index layers and the high-refractive index layers is set to, for example, 0.25 (¼) of the center wavelength of the outgoing light. The composition ratio of Al in each of the low-refractive index layers and the high-refractive index layers may be changed within the range of 0 to 1.

The current confining layer 16b is, for example, AlAs or p-type AlGaAs with a high impurity concentration. When Al is oxidized, $Al_2O_3$ is formed. This causes an increase in electric resistance, so that a current path is confined.

The thickness (optical path length) of the current confining layer 16b is determined depending on the structure used. When importance is placed on extraction efficiency and process reproducibility, the thickness of the current confining layer 16b may be is set to an integer multiple of the thickness (optical path length) of each of the low-refractive index layers and the high-refractive index layers forming the DBR layers. For example, the thickness of the current confining layer 16b is set to 0.75 (¾) of the center wavelength of the outgoing light. When the thickness of the current confining layer 16b is an odd multiple of the center wavelength, the current confining layer 16b may be sandwiched between a high-refractive index layer and another high-refractive index layer. When the thickness of the current confining layer 16b is an even multiple of the center wavelength, the current confining layer 16b may be sandwiched between a high-refractive index layer and a low-refractive index layer. Specifically, the current confining layer 16b may be disposed such that the periodic changes in the refractive index in the DBR layers are not disturbed. To reduce the influence of the oxidized portion (on the refractive index and strain), the thickness of the current confining layer 16b may be several tens of nanometers, and the current confining layer 16b may be inserted into a portion corresponding to a node of a standing wave in the DBR layers.

The light-emitting layer 17 has a quantum well structure including well layers and barrier layers stacked alternately. The well layers are, for example, GaAs, AlGaAs, InGaAs, GaAsP, AlGaInP, GaInAsP, or GaInP, and the barrier layers are, for example, AlGaAs, GaAs, GaInP, or GaInAsP. The light-emitting layer 17 may be quantum wires or quantum boxes (quantum dots).

The n-cathode (DBR) layer 18 includes a combination of high-Al content low-refractive index layers of n-type $Al_{0.9}Ga_{0.1}As$ with an impurity concentration of, for example, $1\times10^{18}/cm^3$ and low-Al content high-refractive index layers of n-type $Al_{0.2}Ga_{0.8}As$ with an impurity concentration of, for example, $1\times10^{18}/cm^3$. The thickness (optical path length) of each of the low-refractive index layers and the high-refractive index layers is set to, for example, 0.25 (¼) of the center wavelength of the outgoing light.

These semiconductor layers are deposited by, for example, metal organic chemical vapor deposition (MOCVD) or molecular beam epitaxy (MBE), and the semiconductor stack is thereby formed.

In the step of forming the cathode electrode 92 shown in FIG. 3B, the cathode electrode 92 is formed on the n-cathode (DBR) layer 18.

The cathode electrode 92 is, for example, Au containing Ge (AuGe) that can easily form an ohmic contact with an n-type semiconductor layer such as the n-cathode layer 18.

The cathode electrode 92 is formed by, for example, a lift-off method.

In the etching step for exposing the tunnel junction layer 15 shown in FIG. 3C, the n-cathode layer 18, the light-emitting layer 17, and the p-anode layer 16 on the tunnel junction layer 15 are partially removed by etching from a circumferential region of the VCSEL.

The etching may be wet etching using, for example, a sulfuric acid-based etching solution (sulfuric acid:hydrogen peroxide water:water=1:10:300 in weight ratio) or anisotropic dry etching (RIE) using, for example, boron chloride.

In the step of forming the current-blocking portion β in the current confining layer 16b shown in FIG. 3D, the current confining layer 16b with its side surfaces exposed in the etching step for exposing the tunnel junction layer 15 is oxidized from the side surfaces to form the current-blocking portion β that blocks an electric current. The remaining non-oxidized portion serves as a current-passing portion α.

In the oxidation of the current confining layer 16b from its side surfaces, Al in the current confining layer 16b formed of, for example, AlAs or AlGaAs is oxidized by, for example, water vapor at 300 to 400° C. In this case, the oxidation proceeds from the exposed side surfaces, and the current-blocking portion β made of $Al_2O_3$, which is an oxide of Al, is formed in a circumferential portion of the VCSEL.

The current-blocking portion β may be formed by implanting hydrogen ions ($H^+$) ($H^+$ implantation) into a semiconductor layer made of, for example, GaAs or AlGaAs (e.g., the p-anode (DBR) layer 16) instead of using a semiconductor layer with a large Al composition ratio such as AlAs. By implanting $H^+$ into a portion that later becomes the current-blocking portion β, impurities are deactivated, so that the current-blocking portion β has a high electric resistance.

In the etching step for exposing the p-gate layer 13 shown in FIG. 3E, the tunnel junction layer 15 and the n-cathode layer 14 are etched to expose the p-gate layer 13.

The etching may be wet etching using, for example, a sulfuric acid-based etching solution (sulfuric acid:hydrogen peroxide water:water=1:10:300 in weight ratio) or anisotropic dry etching (RIE) using, for example, boron chloride.

If the p-gate layer 13 is exposed instead of the tunnel junction layer 15 in the etching step for exposing the tunnel junction layer 15 shown in FIG. 3C, Al contained in the p-gate layer 13 may be oxidized in the step of forming the current-blocking portion β in FIG. 3D. If Al contained in the p-gate layer 13 is oxidized, its surface may be roughened, or adhesion to the control electrode 93 described later may deteriorate. Therefore, the step of forming the current-blocking portion β is performed with the tunnel junction layer 15 exposed.

In the step of forming the anode electrode 91 shown in FIG. 3F, the anode electrode 91 is formed on the rear surface of the substrate 10. The control electrode 93 may be formed on the exposed portion of the p-gate layer 13 (see FIG. 1A) before or after this step.

The anode electrode 91 (the control electrode 93) may be formed of, for example, Au containing Zn (AuZn) that can easily form an ohmic contact with the p-type substrate 10.

The anode electrode 91 (the control electrode 93) is formed by, for example, a lift-off method.

In addition to these steps, the step of forming a protective layer and other steps may be included.

If the control electrode 93 is not provided, the etching step for exposing the p-gate layer 13 in FIG. 3E may be omitted.

Next, modifications of the optical switch C will be described.

<Metallic Conductive III-V Compound Layer>

In the optical switch C described above, the photothyristor T and the VCSEL are stacked through the tunnel junction layer 15.

Instead of the tunnel junction layer 15, a III-V compound layer that is an epitaxially grown III-V compound semiconductor layer having metallic conductivity may be used. In this case, the "tunnel junction layer 15" in the above description is replaced with a "metallic conductive III-V compound layer 15" described below.

Figure 4A:
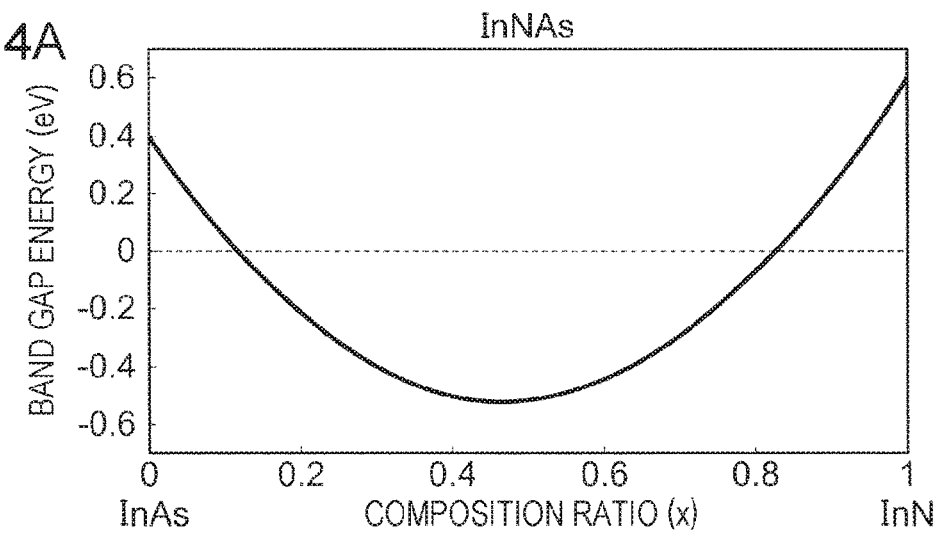
FIG. 4A illustrates the band gap of InNAs versus the composition ratio x of InN, the InNAs being a material forming a metallic conductive III-V compound layer.
Figure 4B:
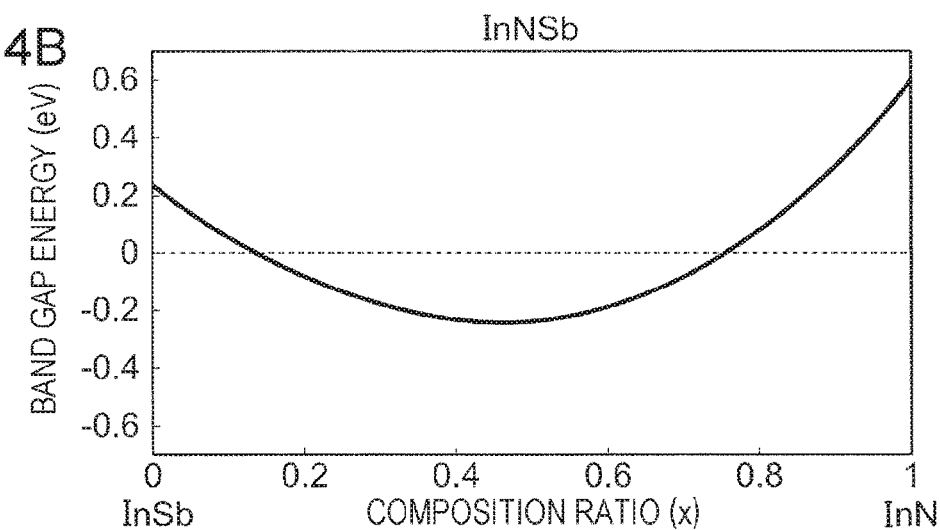
FIG. 4B illustrates the band gap of InNSb versus the composition ratio x of InN, the InNSb being a material forming the metallic conductive III-V compound layer.
Figure 4C:
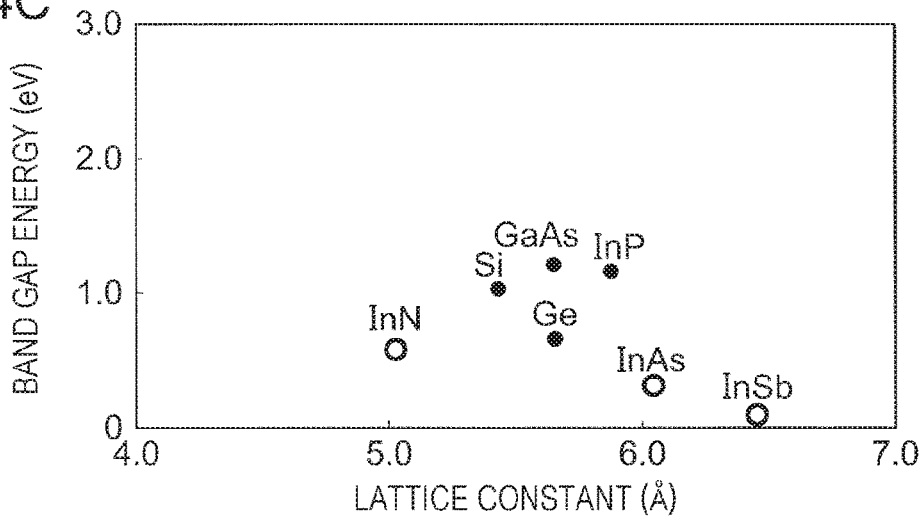
FIG. 4C is a graph showing the lattice constants of group IV elements and III-V compounds versus their band gap.

FIGS. 4A, 4B, and 4C show materials for the metallic conductive III-V compound layer. FIG. 4A is a graph showing the band gap of InNAs versus the composition ratio x of InN. FIG. 4B is a graph showing the band gap of InNSb versus the composition ratio x of InN. FIG. 4C is a graph showing the lattice constants of group IV elements and III-V compounds versus their band gap.

FIG. 4A shows the band gap energy (eV) of InNAs that is a compound of InN with a composition ratio of x (x=0 to 1) and InAs with a composition ratio of (1−x).

FIG. 4B shows the band gap energy (eV) of InNSb that is a compound of InN with a composition ratio of x (x=0 to 1) and InSb with a composition ratio of (1−x).

InNAs and InNSb explained as examples of the material of the metallic conductive III-V compound layer are known to have negative band gap energy in a certain composition ratio x range, as shown in FIGS. 4A and 4B. The negative band gap energy means that no band gap is present. Therefore, the metallic conductive III-V compound layer exhibits the same conductive characteristics (conduction characteristics) as metals. The metallic conductive characteristics (conduction characteristics) mean that a current flows when a potential gradient exists, as in metals.

As shown in FIG. 4A, the band gap energy of InNAs is negative when the composition ratio x of InN is in the range of about 0.1 to about 0.8.

As shown in FIG. 4B, the band gap energy of InNSb is negative when the composition ratio x of InN is about 0.2 to about 0.75.

Specifically, InNAs and InNSb exhibit metallic conductive characteristics (conduction characteristics) in the above ranges.

In small-band gap energy regions outside the above ranges, thermal energy allows electrons to have energy enough to cross the small band gap, so that, when a potential gradient exists, a current easily flows, as in the case where the band gap energy is negative and as in the case of metals.

Even when InNAs or InNSb contains Al, Ga, Ag, P, etc., the band gap energy can be maintained close to 0 or negative depending on the composition, so that a current flows when a potential gradient exists.

As shown in FIG. 4C, the lattice constants of III-V compounds (semiconductors) such as GaAs and InP fall within the range of 5.6 Å to 5.9 Å. These lattice constants are close to the lattice constant of Si, i.e., about 5.43 Å, and the lattice constant of Ge, i.e., 5.66 Å.

The lattice constant of InN, which is a III-V compound, is about 5.0 Å in the zincblende structure, and the lattice constant of InAs is about 6.06 Å. Therefore, the lattice constant of InNAs, which is a compound of InN and InAs, can be close to the lattice constant of GaAs, i.e., 5.6 Å to 5.9 Å.

The lattice constant of InSb, which is a III-V compound, is about 6.48 Å. Since the lattice constant of InN is about 5.0 Å, the lattice constant of InNSb, which is a compound of InSb and InN, can be close to the lattice constant of GaAs, i.e., 5.6 Å to 5.9 Å.

InNAs and InNSb can be monolithically and epitaxially grown on a III-V compound (semiconductor) layer such as a GaAs layer. Moreover, a III-V compound (semiconductor) layer such as a GaAs layer can be monolithically and epitaxially grown on an InNAs or InNSb layer.

Therefore, when the photothyristor T and the VCSEL are stacked so as to be connected in series through the metallic conductive III-V compound layer instead of the tunnel junction layer 15, the n-cathode layer 14 of the photothyristor T and the p-anode (DBR) layer 16 of the VCSEL are prevented from being reverse biased.

<Voltage Reduction Layer 19>

In the optical switch C described above, the photothyristor T and the VCSEL are stacked through the tunnel junction layer 15. In this case, the photothyristor T and the VCSEL are electrically connected in series. Therefore, the absolute value of the voltage applied to the optical switch C is larger than a voltage applied to each of the photothyristor T and the VCSEL separately. To reduce the voltage applied to the optical switch C, a voltage reduction layer 19 for reducing the voltage may be used for the photothyristor T.

FIGS. 5A, 5B, and 5C are illustrations showing an optical switch C including a photothyristor T having a voltage reduction layer 19 and the VCSEL that are stacked one on another. FIG. 5A is a cross-sectional view of the optical switch C, and FIG. 5B is a top view. FIG. 5C shows an equivalent circuit of the optical switch C. The optical switch C in FIGS. 5A, 5B, and 5C is obtained by adding the voltage reduction layer 19 to the optical switch C in FIGS. 1A, 1B, and 1C. Therefore, the same parts as those in FIGS. 1A, 1B, and 1C are denoted by the same symbols, and their description will be omitted. A description will be given of different parts.

The voltage reduction layer 19 is disposed between the p-anode layer 11 and the n-gate layer 12 of the photothyristor T.

The voltage reduction layer 19 may be a p-type layer having the same impurity concentration as the p-anode layer 11 and serving as part of the p-anode layer 11 or may be an n-type layer having the same impurity concentration as the n-gate layer 12 and serving as part of the n-gate layer 12. The voltage reduction layer 19 may be an i-layer.

Figure 6A:
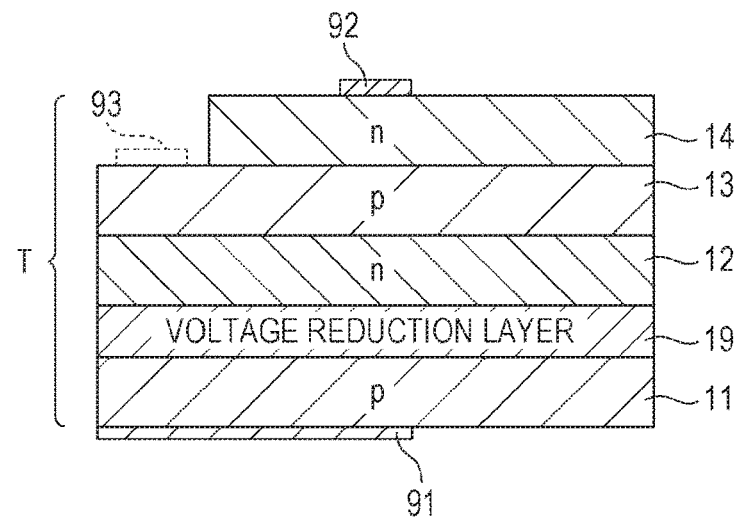
FIG. 6A is a cross-sectional view illustrating the structure of the thyristor including the voltage reduction layer.
Figure 6B:
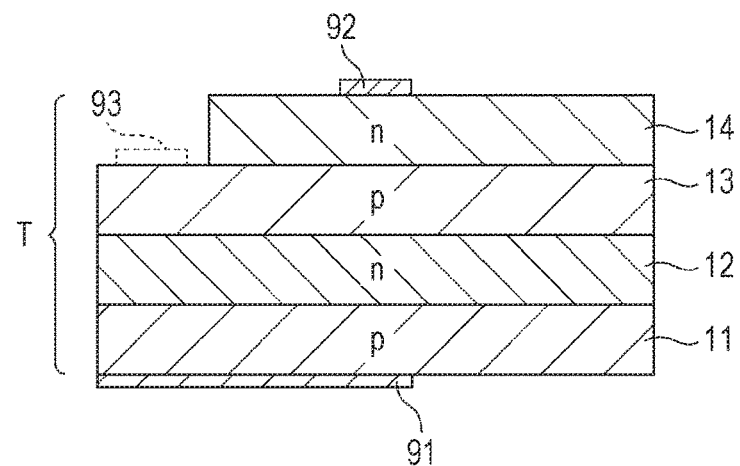
FIG. 6B is a cross-sectional view illustrating the structure of a thyristor including no voltage reduction layer.
Figure 6C:
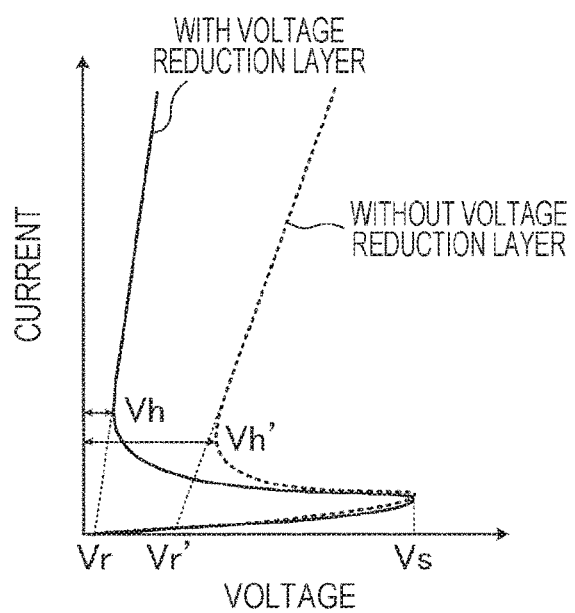
FIG. 6C shows the characteristics of the thyristors.

FIGS. 6A, 6B, and 6C show the structures and characteristics of thyristors. FIG. 6A is a cross-sectional view of a thyristor including the voltage reduction layer 19, and FIG. 6B is a cross-sectional view of a thyristor including no voltage reduction layer 19. FIG. 6C shows the characteristics of the thyristors. FIGS. 6A and 6B correspond to cross sections of photothyristors T with no VCSEL stacked on their upper side. The cathode electrode 92 is disposed on the front surface of the n-cathode layer 14.

The thyristor shown in FIG. 6A includes the voltage reduction layer 19 disposed between the p-anode layer 11 and the n-gate layer 12. When the voltage reduction layer 19 is a p-type layer with the same impurity concentration as the p-anode layer 11, the voltage reduction layer 19 acts as part of the p-anode layer 11. When the voltage reduction layer 19 is an n-type layer with the same impurity concentration as the n-gate layer 12, the voltage reduction layer 19 acts as part of the n-gate layer 12. The voltage reduction layer 19 may be an i-layer.

The thyristor shown in FIG. 6B does not include the voltage reduction layer 19.

The rising voltage Vr of a thyristor (see FIG. 6C) is determined by the smallest band gap energy in the semiconductor layers forming the thyristor. The rising voltage Vr of a thyristor is a voltage obtained by extrapolating the current flowing through the thyristor in the on state to the voltage axis.

The voltage reduction layer 19 in the above thyristor has a smaller band gap energy than the p-anode layer 11, the n-gate layer 12, the p-gate layer 13, and the n-cathode layer 14. Therefore, as shown in FIG. 6C, the rising voltage Vr of the thyristor including the voltage reduction layer 19 is lower than the rising voltage Vr' of the thyristor including no voltage reduction layer 19. For example, the voltage reduction layer 19 has a smaller band gap than the light-emitting layer 17.

The photothyristor T is not used as a light-emitting element but is used for the purpose of driving the VCSEL. The band gap may be determined irrespective of the wavelength of light actually emitted from the VCSEL. Therefore, by providing the voltage reduction layer 19 having a smaller band gap than the light-emitting layer 17, the rising voltage Vr of the thyristor is reduced.

In this manner, the voltage applied to the thyristor and the light-emitting element when they are in the on state is reduced.

Figure 7:
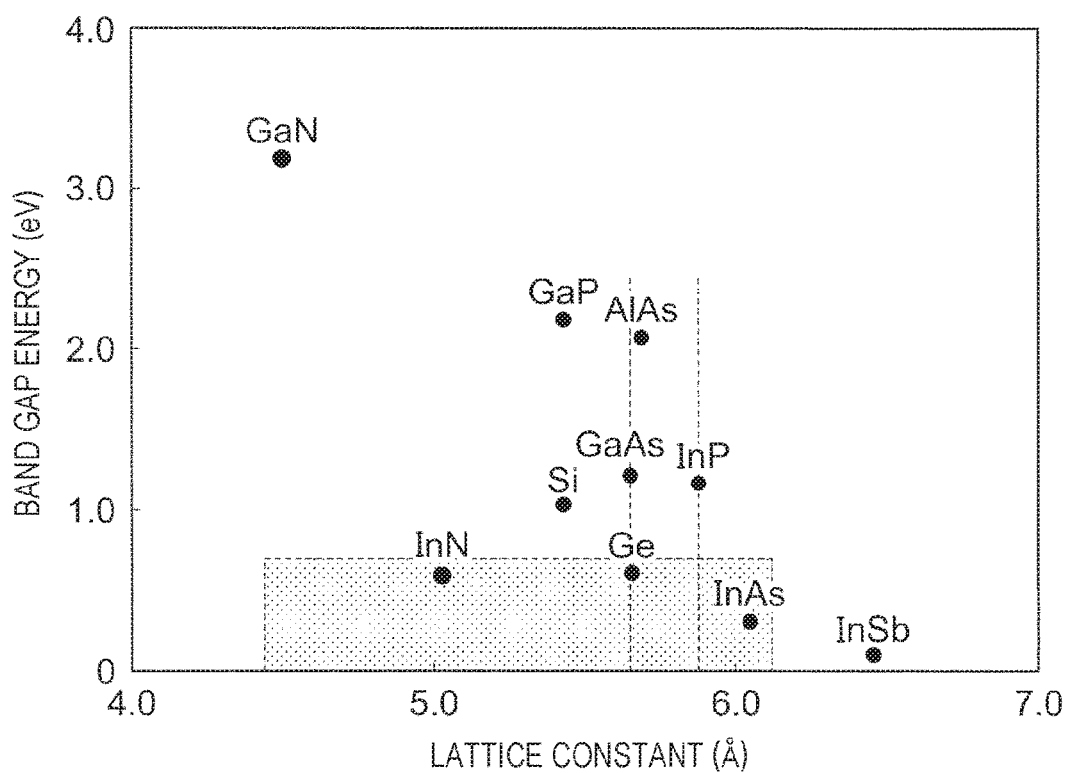
FIG. 7 is a graph showing the band gap energies of materials forming semiconductor layers.

FIG. 7 is a graph showing the band gap energies of materials forming semiconductor layers.

The lattice constant of GaAs is about 5.65 Å. The lattice constant of AlAs is about 5.66 Å. Therefore, a material having a lattice constant close to these lattice constants can be epitaxially grown on a GaAs substrate. For example, Ge and AlGaAs, which is a compound of GaAs and AlAs, can be epitaxially grown on a GaAs substrate.

The lattice constant of InP is about 5.87 Å. A material having a lattice constant close to this lattice constant can be epitaxially grown on an InP substrate.

The lattice constant of GaN depends on its growth face. The lattice constant of the a-plane is 3.19 Å, and the lattice constant of the c-plane is 5.17 Å. A material having a lattice constant close to one of these lattice constants can be epitaxially grown on a GaN substrate.

Materials in a shaded region in FIG. 7 can be used for GaAs, InP, and GaN because these materials have band gap energies that can reduce the rising voltage of the thyristor. Specifically, when a material in the shaded region is used for a layer included in the thyristor, the rising voltage Vr of the thyristor is equal to the band gap energy of the material in the shaded region.

For example, the band gap energy of GaAs is about 1.43 eV. Therefore, when the voltage reduction layer 19 is not used, the rising voltage Vr of the thyristor is about 1.43 V. When a material in the shaded region is used for or contained in a layer included in the thyristor, the rising voltage Vr of the thyristor can be more than 0 V and less than 1.43 V (0 V<Vr<1.43 V).

This can reduce power consumption when the thyristor is in the on state.

Among the materials in the shaded region, Ge having a band gap energy of about 0.67 eV can be used for GaAs. InAs having a band gap energy of about 0.36 eV can be used for InP. For a GaAs substrate and an InP substrate, a material with a small band gap energy that is selected from a compound of GaAs and InP, a compound of InN and InSb, a compound of InN and InAs, etc. can be used. In particular, a GaInNAs-based mixed compound is suitable. The above compounds may contain Al, Ga, As, P, Sb, etc. For GaN, GaNP can serve as the voltage reduction layer 19. In addition, for example, (1) an InN layer and an InGaN layer obtained by, for example, metamorphic growth, (2) InN, InGaN, InNAs, and InNSb quantum dots, (3) an InAsSb layer with a lattice constant corresponding to twice the lattice constant of GaN (the a-plane) may be introduced as the voltage reduction layer 19. These may contain Al, Ga, N, As, P, Sb, etc.

The rising voltages Vr and Vr' of the thyristors have been described. The same applies to hold voltages Vh and Vh' that are minimum voltages at which the thyristors can maintain the on state and to the voltages applied to the thyristors in the on state (see FIG. 6C).

The switching voltage Vs of each thyristor (see FIG. 6C) is determined by the depletion layer in reverse biased semiconductor layers. Therefore, the influence of the voltage reduction layer 19 on the switching voltage Vs of the thyristor is small.

Specifically, the voltage reduction layer 19 reduces the rising voltage Vr while the switching voltage Vs of the thyristor is maintained. Therefore, the voltage applied to the thyristor in the on state is reduced, and the power consumption is thereby reduced. The switching voltage Vs of the thyristor is set to any value by adjusting the materials, impurity concentrations, etc. of the p-anode layer 11, the n-gate layer 12, the p-gate layer 13, and the n-cathode layer 14. However, the switching voltage Vs varies depending on the insertion position of the voltage reduction layer 19.

In the example shown in FIG. 5A, one voltage reduction layer 19 is provided, but plural voltage reduction layers 19 may be provided. For example, a voltage reduction layer 19 is provided between the p-anode layer 11 and the n-gate layer 12, and another voltage reduction layer 19 is provided between the p-gate layer 13 and the n-cathode layer 14. Alternatively, a voltage reduction layer 19 is provided in the n-gate layer 12, and one voltage reduction layer 19 may be provided in the p-gate layer 13. One, two, or three layers may be selected from the p-anode layer 11, the n-gate layer 12, the p-gate layer 13, and the n-cathode layer 14, and a voltage reduction layer 19 may be provided in each of the selected layers. The conduction type of each voltage reduction layer may be the same as the conduction type of the anode, cathode, or gate layer in which the voltage reduction layer is provided or may be i-type.

FIGS. 8A and 8B illustrate the logical operations of the optical switch C. FIG. 8A shows a logical product (AND) circuit, and FIG. 8B shows a logical sum (OR) circuit. These optical switches C are the same as the optical switch C shown in FIG. 1C. The power source PS supplies a pulse signal having "H" (0 V) and "L" (−3.2 V) levels.

Specifically, even when the photothyristor T in the optical switch C is in the on state, the photothyristor T is turned into the off state when the power source PS is at the "H" (0 V) level.

In the AND circuit shown in FIG. 8A, optical signals A and B in the form of incoming light (the incoming light IN1 or the incoming light IN2) are inputted to the photothyristor T when the power source PS is at the "L" (−3.2 V) level. The photothyristor T has been set such that it is turned on (switched to the on state) when both the optical signals A and B are inputted. When neither of the optical signals A and B are inputted or when only one of them is inputted, the photothyristor T is not turned on, and the VCSEL of the optical switch C is not switched to the on state. Therefore, outgoing light (the outgoing light OUT1 or the outgoing light OUT2) is not generated.

However, when both the optical signals A and B are inputted to the photothyristor T of the optical switch C, the photothyristor T is turned on (switched to the on state). Then the VCSEL of the optical switch C is switched from the off state to the on state, and outgoing light (the outgoing light OUT1 or the outgoing light OUT2) is generated.

By inputting optical signals A and B each corresponding to a logical value 0/1 to the photothyristor T of the optical switch C when the power source PS is at the "L" (−3.2 V) level, outgoing light corresponding to the logical product of the optical signals A and B (i.e., A·B) is outputted from the VCSEL. When the output of the power source PS is changed to the "H" (0 V) level, the photothyristor T is turned off, and the light emission from the VCSEL is stopped. Specifically, by inputting optical signals A and B in the form of incoming light to the photothyristor T sequentially each time the power source PS is at the "L" (−3.2 V) level, optical signals A·B corresponding to the logical products of the optical signals A and B are sequentially outputted from the VCSEL.

Therefore, the optical switch C functions as a logical product (AND) circuit that generates an optical signal from optical signals.

In the OR circuit shown in FIG. 8B, the photothyristor T has been set such that it is turned on (switched to the on state) when at least one of the optical signals A and B is inputted. When neither of the optical signals A and B are inputted, the photothyristor T is not switched to the on state, and also the VCSEL of the optical switch C is not switched to the on state. Therefore, outgoing light (the outgoing light OUT1 or the outgoing light OUT2) is not generated.

However, when one or both of the optical signals A and B are inputted, the photothyristor T is turned on (switched to the on state, and the VCSEL of the optical switch C is switched to the on state, so that outgoing light (the outgoing light OUT1 or the outgoing light OUT2) is generated.

By inputting optical signals A and B each corresponding to a logical value 0/1 to the photothyristor T of the optical switch C when the power source PS is at the "L" (−3.2 V) level, outgoing light corresponding to the logical sum of the optical signals A and B (i.e., A+B) is outputted from the VCSEL. When the output of the power source PS is changed to the "H" (0 V) level, the photothyristor T is turned off, and the light emission from the VCSEL is stopped. Specifically, by inputting optical signals A and B in the form of incoming light to the photothyristor T sequentially each time the power source PS is at the "L" (−3.2 V) level, optical signals A+B corresponding to the logical sums of the optical signals A and B are sequentially outputted from the VCSEL.

Therefore, the optical switch C functions as a logical sum (OR) circuit that generates an optical signal from optical signals.

FIGS. 9A and 9B illustrate other logical operations of an optical switch C. FIG. 9A shows a negative logical product (NAND) circuit, and FIG. 9B shows a negative logical sum (NOR) circuit. In the above circuits, two optical switches C1 and C2 are connected in parallel to one power source PS to form the optical switch C. The two optical switches C1 and C2 share a current-limiting resistor RI. The photothyristors T of the optical switches C1 and C2 have the same characteristics, and also their VCSELs have the same characteristics. The rest of the configuration is the same as that in FIGS. 9A and 9B.

The negative logical product (NAND) circuit shown in FIG. 9A will be described.

Signals A and B are inputted to the optical switch C1 of the NAND circuit, and a reference optical signal R is inputted to the optical switch C2. The optical switches C1 and C2 have been set such that they are turned on when light with an intensity equal to or higher than the light intensity of the reference optical signal R is inputted. The light intensity of the reference optical signal R has been set to be lower than the sum of the optical intensities of the optical signals A and B and higher than the light intensity of each of the optical signals A and B. When the photothyristors T of the optical switches C1 and C2 receive optical signals having intensities equal to or higher than the light intensity of the reference optical signal R, one of the photothyristors T which receives light with a higher intensity is turned on first.

When the optical signals A and B are inputted to the photothyristor T of the optical switch C1 simultaneously, the reference optical signal R is inputted to the photothyristor T of the optical switch C2. Since the total light intensity of the optical signals A and B (optical signals A+B) is higher than the light intensity of the reference optical signal R, the photothyristor T of the optical switch C1 is turned on. Then the VCSEL of the optical switch C1 emits light (oscillates), and outgoing light (outgoing light OUT1 or outgoing light OUT2) is generated. In this case, the voltage applied to the series connection of the photothyristor T and VCSEL of the optical switch C1 drops to −2.2 V.

Similarly, the voltage applied to the series connection of the photothyristor T and VCSEL of the optical switch C2 drops to −2.2 V. The photothyristor T of the optical switch C2 has been set such that, in this case, the photothyristor T is not turned on although the reference optical signal R is inputted to the photothyristor T. Therefore, the VCSEL of the optical switch C2 does not emit light.

When one of the optical signals A and B is inputted to the photothyristor T of the optical switch C1 or when neither of the optical signals A and B are inputted, the photothyristor T of the optical switch C1 is not turned on. However, since the reference optical signal R is inputted to the optical switch C2, the photothyristor T of the optical switch C2 is turned on. Then the VCSEL of the optical switch C2 emits light (oscillates), and outgoing light (outgoing light OUT1 or outgoing light OUT2) is generated.

By inputting optical signals A and B each corresponding to a logical value 0/1 to the photothyristor T of the optical switch C1 when the power source PS is at the "L" (−3.2 V) level, outgoing light (the outgoing light OUT1 or the outgoing light OUT2) corresponding to the negative logical product (NAND) of the optical signals A and B is emitted from the VCSEL of the optical switch C2. When the output of the power source PS is changed to the "H" (0 V) level, the photothyristor T of the optical switch C1 or the photothyristor T of the optical switch C2 is turned off, and the light emission from the corresponding VCSEL is stopped. Specifically, by inputting optical signals A and B in the form of incoming light (incoming light IN1 or incoming light IN2) to the photothyristor T of the optical switch C1 sequentially each time the power source PS is at the "L" (−3.2 V) level, outgoing light (the outgoing light OUT1 or the outgoing light OUT2) corresponding to the negative logical product (NAND) of the optical signals A and B is sequentially outputted from the VCSEL of the optical switch C2.

Specifically, the optical switch C including the optical switches C1 and C2 functions as a negative logical product (NAND) circuit that generates an optical signal from optical signals.

Outgoing light (outgoing light OUT1 or outgoing light OUT2) corresponding to the logical product (AND) of the optical signals A and B is outputted from the VCSEL of the optical switch C1.

The negative logical sum (NOR) circuit shown in FIG. 9B will be described.

Signals A and B are inputted to the optical switch C1 of the NOR circuit, and a reference optical signal R is inputted to the optical switch C2. The optical switches C1 and C2 have been set such that they are turned on when light with a light intensity equal to or higher than the intensity of the reference optical signal R is inputted. The light intensity of the reference optical signal R has been set to be lower than the light intensity of each of the optical signals A and B. When the photothyristors T of the optical switches C1 and C2 receive optical signals having intensities equal to or higher than the light intensity of the reference optical signal R, one of the photothyristors T which receives light with a higher intensity is turned on first.

First, consider the case in which the optical signals A and B are inputted to the photothyristor T of the optical switch C1 simultaneously or one of the optical signals A and B is inputted. The reference optical signal R is inputted to the photothyristor T of the optical switch C2. Since the intensity of the light inputted to the photothyristor T of the optical switch C1 is higher than the light intensity of the reference optical signal R, the photothyristor T of the optical switch C1 is turned on. Then the VCSEL of the optical switch C1 emits light, and outgoing light (outgoing light OUT1 or outgoing light OUT2) is generated. In this case, the voltage applied to the series connection of the photothyristor T and VCSEL of the optical switch C1 drops to −2.2 V.

Similarly, the voltage applied to the series connection of the photothyristor T and VCSEL of the optical switch C2 drops to −2.2 V. The photothyristor T of the optical switch C2 has been set such that, in this case, the photothyristor T is not turned on although the reference optical signal R is inputted to the photothyristor T. Therefore, the VCSEL of the optical switch C2 does not emit light.

When neither of the optical signals A and B are inputted to the photothyristor T of the optical switch C1, the photothyristor T of the optical switch C1 is not turned on. However, since the reference optical signal R is inputted to the optical switch C2, the photothyristor T of the optical switch C2 is turned on. Then the VCSEL of the optical switch C2 emits light.

By inputting optical signals A and B (incoming light IN1 or incoming light IN2) each corresponding to a logical value 0/1 to the photothyristor T of the optical switch C1 when the power source PS is at the "L" (−3.2 V) level, outgoing light (the outgoing light OUT1 or the outgoing light OUT2) corresponding to the negative logical sum (NOR) of the optical signals A and B is emitted from the VCSEL of the optical switch C2. When the output of the power source PS is changed to the "H" (0 V) level, the photothyristor T of the optical switch C1 or the photothyristor T of the optical switch C2 is turned off, and the light emission from the corresponding VCSEL is stopped. Specifically, by inputting optical signals A and B in the form of incoming light (the incoming light IN1 or the incoming light IN2) to the photothyristor T of the optical switch C1 sequentially each time the power source PS is at the "L" (−3.2 V) level, outgoing light (the outgoing light OUT1 or the outgoing light OUT2) corresponding to the negative logical sum (NOR) of the optical signals A and B is sequentially outputted from the VCSEL of the optical switch C2.

Specifically, the optical switch C including the optical switches C1 and C2 functions as a negative logical sum (NOR) circuit that generates an optical signal from optical signals.

Outgoing light (the outgoing light OUT1 or the outgoing light OUT2) corresponding to the logical sum (OR) of the optical signals A and B is outputted from the VCSEL of the optical switch C1.

As described above, the optical switch C can form the negative logical product (NAND) circuit and the negative logical sum (NOR) circuit. Therefore, the optical switch C can perform any logical operation using light.

Figure 10C:
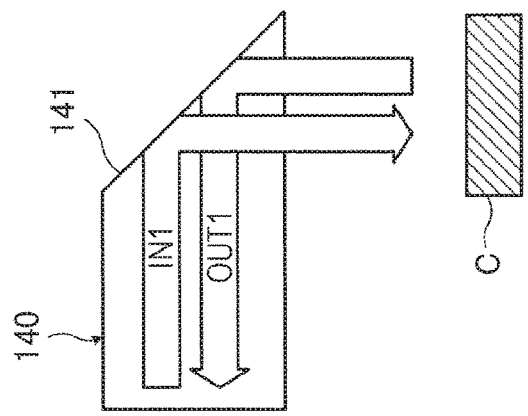
FIGS. 10A, 10B, and 10C illustrate examples of coupling with the optical switch when light is incident on the front surface of the optical switch and outgoing light is emitted from the front surface.
Figure 10B:
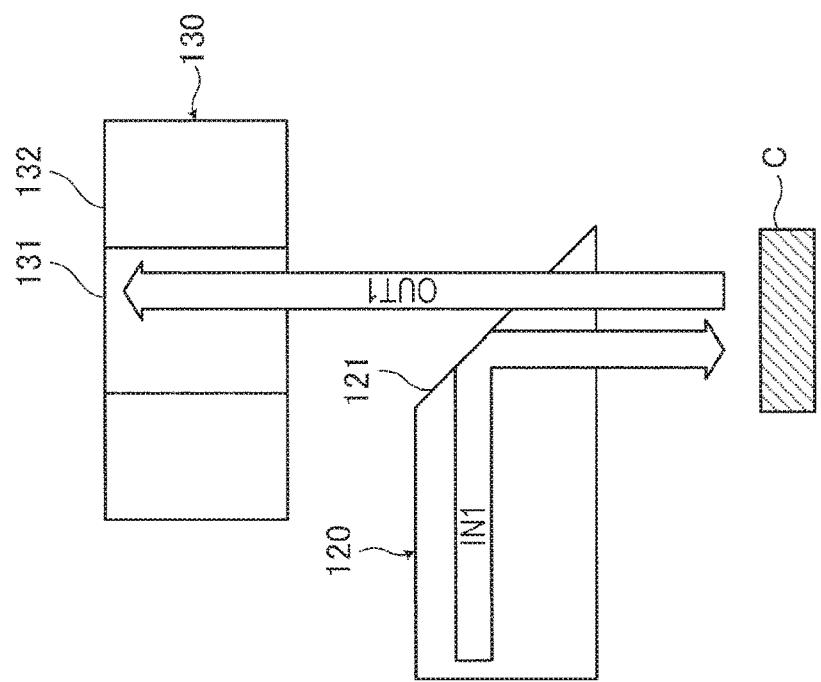
Figure 10A:
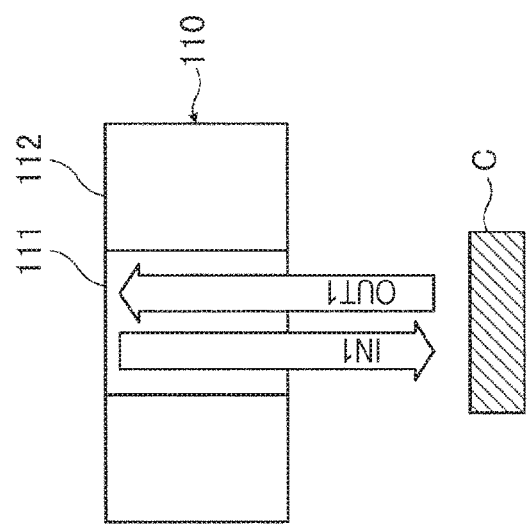

FIGS. 10A, 10B, 10C, 11A, and 11B show examples of coupling with the optical switch C. In FIGS. 10A, 10B, and 10C, light is incident on the front surface of the optical switch C, and outgoing light is emitted from the front surface. In FIGS. 11A and 11B, light is incident on the rear surface of the optical switch C, and outgoing light is emitted from the front surface.

FIG. 10A illustrates the coupling between the optical switch C and an optical fiber 110. In the optical fiber 110, a central core 11 is surrounded by a cladding 112. The incoming light IN1 from the core 111 of the optical fiber 110 enters the optical switch C, and the outgoing light OUT1 from the optical switch C enters the core 111 of the optical fiber 110.

Specifically, optical signals propagate from the optical fiber 110 through the optical switch C to the optical fiber 110.

FIG. 10B illustrates the coupling among the optical switch C, an optical waveguide 120, and an optical fiber 130. The optical waveguide 120 has an end face 121 serving as a 45° half mirror. In the optical fiber 130, a central core 131 is surrounded by a cladding 132.

The incoming light IN1 propagating through the optical waveguide 120 is reflected by the end face 121 and enters the optical switch C. The outgoing light OUT1 from the optical switch C passes through the end face 121 of the optical waveguide 120 and enters the core 131 of the optical fiber 130.

Specifically, optical signals propagate from the optical waveguide 120 through the optical switch C to the optical fiber 130.

FIG. 10C illustrates the coupling between the optical switch C and an optical waveguide 140. The optical waveguide 140 has an end face 141 serving as a 45° mirror.

The incoming light IN1 propagating through the optical waveguide 140 is reflected by the end face 141 and enters the optical switch C. The outgoing light OUT1 from the optical switch C is reflected by the end face 141 of the optical waveguide 140 and propagates through the optical waveguide 140.

Specifically, optical signals propagate from the optical waveguide 140 through the optical switch C to the optical waveguide 140.

FIG. 11A illustrates the coupling among the optical switch C and optical fibers 150 and 160. In the optical fiber 150, a central core 151 is surrounded by a cladding 152. In the optical fiber 160, a central core 161 is surrounded by a cladding 162.

The incoming light IN2 propagating through the core 151 of the optical fiber 150 is incident on the rear surface of the optical switch C. The outgoing light OUT1 from the front surface of the optical switch C enters the core 161 of the optical fiber 160.

Specifically, optical signals propagate from the optical fiber 150 through the optical switch C to the optical fiber 160.

FIG. 11B illustrates the coupling among the optical switch C, an optical waveguide 170, and an optical fiber 180. In the optical fiber 180, a central core 181 is surrounded by a cladding 182.

The incoming light IN2 propagating through the optical waveguide 170 is incident on the rear surface of the optical switch C. The outgoing light OUT1 from the front surface of the optical switch C enters the core 181 of the optical fiber 180.

Specifically, optical signals propagate from the optical waveguide 170 through the optical switch C to the optical fiber 180.

The couplings described above are examples, and other structures may be used for coupling.

[Second Exemplary Embodiment]

FIGS. 12A, 12B, and 12C illustrate an optical switch C according to a second exemplary embodiment. FIG. 12A is a cross-sectional view of the optical switch C, and FIG. 12B is a top view. FIG. 12C shows an equivalent circuit of the optical switch C.

The optical switch C according to the second exemplary embodiment includes a p-type substrate 10 (a substrate 10) and further includes a DBR layer (a p-anode (DBR) layer 16) that functions as an anode of a VCSEL, a light-emitting layer 17, and a DBR layer (an n-cathode (DBR) layer 18) that functions as a cathode of the VCSEL, and these layers are disposed on the substrate 10.

A tunnel junction (tunnel diode) layer 15 is disposed on the n-cathode (DBR) layer 18. The tunnel junction layer 15 includes an $n^{++}$ layer 15a doped with an n-type impurity (dopant) at a high concentration and a $p^{++}$ layer 15b doped with a p-type impurity at a high concentration.

A p-type anode layer 11 (a p-anode layer 11) that functions as an anode of a photothyristor T, an n-type gate layer 12 (an n-gate layer 12) that functions as a gate, a p-type gate layer 13 (a p-gate layer 13) that functions as another gate, and an n-type cathode layer 14 (an n-cathode layer 14) that functions as a cathode are stacked in this order on the tunnel junction layer 15.

In the optical switch C according to the first exemplary embodiment shown in FIG. 1A, the photothyristor T and the VCSEL are stacked in this order on the substrate 10 through the tunnel junction layer 15. In the optical switch C according to the second exemplary embodiment shown in FIG. 12A, the VCSEL and the photothyristor T are stacked in this order on the substrate 10 through the tunnel junction layer 15. Specifically, the optical switch C according to the first exemplary embodiment and the optical switch C according to the second exemplary embodiment differ from each other in that the stacking order is reversed.

The other components are the same as those of the optical switch C described in the first exemplary embodiment and are denoted by the same numerals, and the description thereof will be omitted.

The optical switch C according to the second exemplary embodiment operates similarly to the optical switch C according to the first exemplary embodiment.

The optical switch C according to the second exemplary embodiment is produced in a manner similar to that for the optical switch C according to the first exemplary embodiment.

The metallic conductive III-V compound layer described in the first exemplary embodiment may be used instead of the tunnel junction layer 15, and the voltage reduction layer 19 may be used in the photothyristor T.

The impurity concentration in the tunnel junction layer 15 disposed between the photothyristor T and the VCSEL is high. For example, the impurity concentration in the tunnel junction layer 15 is $10^{19}/cm^3$, which is higher than the impurity concentration in other layers that ranges from $10^{17}$ to $10^{18}/cm^3$. The lattice constant, bond strength, the number of outermost electrons, etc. of Si used as the impurity differ from those of GaAs which is an example of a base semiconductor material. Therefore, when a semiconductor layer such as a GaAs layer is grown on the tunnel junction layer 15, defects are easily formed. The probability of defect formation increases as the impurity concentration increases. The defects formed propagate to semiconductor layers formed on the GaAs layer.

To form a layer, such as the tunnel junction layer 15, having a higher impurity concentration than other layers, it is necessary to use low-temperature growth. Specifically, it is necessary to change the conditions of growth (temperature, growth rate, ratios). Therefore, the semiconductor layer disposed on the tunnel junction layer 15 is formed under conditions different from optimal growth conditions.

As a result, the semiconductor layer disposed on the tunnel junction layer 15 contains a large number of defects.

In particular, the light emission characteristics of a light-emitting element such as the VCSEL are susceptible to defects contained in semiconductor layers. However, it is only necessary that the photothyristor T be turned on by incident light to allow a current to be supplied to the VCSEL. Specifically, the photothyristor T is less susceptible to defects than the VCSEL.

Therefore, in the optical switch C according to the second exemplary embodiment, the VCSEL is disposed on the substrate 10, and the photothyristor T is disposed on the VCSEL through the tunnel junction layer 15. In this manner, the formation of defects in the VCSEL is suppressed, and the influence of defects on the light emission characteristics of the VCSEL is reduced. Then the photothyristor T is monolithically stacked on the VCSEL.

This is also the case when the metallic conductive III-V compound layer is used instead of the tunnel junction layer 15.

The metallic conductive III-V compound layer formed of InNAs, InNSb, etc., theoretically has a negative band gap but is less easily grown than GaAs, InP, etc., and the quality of the metallic conductive III-V compound layer is poor. In particular, when the content of N is large, the degree of difficulty in growth increases significantly. In this case, when a semiconductor layer such as a GaAs layer is formed on the metallic conductive III-V compound layer, defects are easily formed.

Therefore, the VCSEL is disposed on the substrate 10, and the photothyristor T is disposed on the VCSEL through the metallic conductive III-V compound layer, as in the case of the tunnel junction layer 15. In this manner, the formation of defects in the VCSEL is suppressed, and the influence of defects on the light emission characteristics of the VCSEL is reduced. Then the photothyristor T can be monolithically stacked on the VCSEL.

This is also the case when the voltage reduction layer 19 is used.

The material used for the voltage reduction layer 19 is less easily grown than GaAs, InP, etc., and the quality of the voltage reduction layer 19 is poor. When a semiconductor layer such as a GaAs layer is formed on the voltage reduction layer 19, defects are easily formed.

Therefore, the VCSEL is disposed on the substrate 10, and the photothyristor T is disposed on the VCSEL through the tunnel junction layer 15 or the metallic conductive III-V compound layer. The voltage reduction layer 19 is inserted in the photothyristor T. In this manner, the formation of defects in the VCSEL is suppressed, and the influence of defects on the light emission characteristics of the VCSEL is reduced. Then the photothyristor T can be monolithically stacked on the VCSEL.

[Third Exemplary Embodiment]

FIGS. 13A and 13B illustrate an optical switch C according to a third exemplary embodiment. FIG. 13A is a cross-sectional view of the optical switch C, and FIG. 13B is a top view. The equivalent circuit of the optical switch C according to the third exemplary embodiment is the same as that of the optical switch C according to the second exemplary embodiment shown in FIG. 12C, and therefore the description of the equivalent circuit will be omitted.

The optical switch C according to the third exemplary embodiment has an opening 20 hollowed out in a central portion of the photothyristor T. The opening 20 has a circular cross-sectional shape and is formed from the front surface of the photothyristor T toward the VCSEL. An annular cathode electrode 92 is disposed on the n-cathode layer 14 so as to surround the opening 20.

The cross-sectional shape of the opening 20 is not limited to a circular shape, and the shape of the cathode electrode 92 is not limited to an annular shape.

The opening 20 is formed by hollowing out the central portion of the photothyristor T. However, the opening 20 may be formed in a portion other than the central portion and may be formed in an edge portion of the photothyristor T. It is only necessary that the opening 20 be formed from the front surface of the photothyristor T toward the VCSEL.

By forming the opening 20, incoming light and outgoing light can have the same wavelength, and the outgoing light can be emitted in the incident direction of the incoming light.

In the optical switch C according to the second exemplary embodiment shown in FIG. 12A, it is not desirable for the incoming light IN1 and the outgoing light OUT1 to have the same wavelength. This is because of the following reason. The incoming light IN1 is absorbed by the photothyristor T. If the VCSEL emits light having the same wavelength as the incoming light IN1, this light is also absorbed by the photothyristor T. Therefore, it is difficult to obtain the outgoing light OUT1 without influence of the photothyristor T.

Similarly, it is not desirable for the incoming light IN2 and the outgoing light OUT2 to have the same wavelength.

However, in the optical switch C according to the third exemplary embodiment shown in FIG. 13A, the incoming light IN1 is incident on a side wall of the photothyristor T within the opening 20. The photothyristor T is thereby turned on. Then the VCSEL is switched to the on state and emits, as the outgoing light OUT1, light with the same wavelength as the incoming light IN1. In this case, the outgoing light OUT1 is unlikely to be absorbed by the photothyristor T because the photothyristor T is not present within the opening 20.

Therefore, the wavelength of the light absorbed by the optical switch C to turn it on can be the same as the wavelength of the light emitted from the VCSEL.

The outgoing light OUT1 can be emitted in the incident direction of the incoming light IN1. Therefore, it is not necessary to use the incoming light IN2 and the outgoing light OUT2 that pass through the substrate 10. Thus, the efficiency of utilization of the incoming light and the outgoing light is high.

The opening 20 may have a shape 20a having a side wall perpendicular to the substrate 10. The incoming light IN1 directed to the optical switch C includes components propagating in directions oblique to the substrate 10 (the incoming light IN1 has a divergence angle). Even when the opening 20 has the shape 20a having the side wall perpendicular to the substrate 10, the photothyristor T can be turned on by the incoming light IN1. Therefore, when the opening 20 is formed by hollowing out the central portion of the photothyristor T, the incoming light can be efficiently used.

The opening 20 may have a shape 20b having a side wall inclined with respect to the substrate 10. In this case, the side wall of the opening 20 receives the incoming light IN1, so that a larger amount of light is incident on the photothyristor T. This allows the photothyristor T to operate easily. Specifically, the effective sensitivity of the photothyristor T to the amount of incoming light is improved. The effective sensitivity is the amount of light necessary to turn on the photothyristor T. The amount of incoming light IN1 necessary to turn on the photothyristor T when the side wall of the opening 20 is inclined is smaller than the amount of incoming light IN1 necessary to turn on the photothyristor T when the side wall of the opening 20 is perpendicular. Therefore, it appears as if the sensitivity of the photothyristor T is improved.

The opening 20 may have a shape 20c having a bottom that does not reach the VCSEL. Part of the tunnel junction layer 15 and part of the p-anode layer 11 of the photothyristor T may remain on the surface of the n-cathode (DBR) layer 18 of the VCSEL. In this case, the outgoing light OUT1 is emitted through the tunnel junction layer 15 and the p-anode layer 11 of the photothyristor T that partially remain on the bottom of the opening 20.

The metallic conductive III-V compound layer described in the first exemplary embodiment may be used instead of the tunnel junction layer 15, and the voltage reduction layer 19 may be used in the photothyristor T.

[Fourth Exemplary Embodiment]

FIGS. 14A and 14B illustrate an optical switch C according to a fourth exemplary embodiment. FIG. 14A is a cross-sectional view of the optical switch C, and FIG. 14B is a top view. The equivalent circuit of the optical switch C according to the fourth exemplary embodiment is the same as that of the optical switch C according to the second exemplary embodiment shown in FIG. 12C, and the description of the equivalent circuit will be omitted.

The optical switch C according to the fourth exemplary embodiment has an opening 20 hollowed out in a central portion of the photothyristor T, as does the optical switch C according to the third exemplary embodiment. The opening 20 has a circular cross-sectional shape and is formed from the front surface of the photothyristor T toward the VCSEL. An arc-shaped cathode electrode 92 is disposed on the n-cathode layer 14 so as to surround one-half of the opening 20.

The cross-sectional shape of the opening 20 is not limited to a circular shape. The cathode electrode 92 may not surround one-half of the opening 20 but may surround, for example, three-fourths or one-fourth of the opening 20. Specifically, it is only necessary that part of the front surface of the n-cathode layer 14 be uncovered with the cathode electrode.

In this manner, the incoming light IN1 enters the photothyristor T not only through the side wall of the opening 20 but also through the portion of the n-cathode layer 14 that is uncovered with the cathode electrode 92. In this case, a larger amount of light enters the photothyristor T, allowing the photothyristor T to operate easily. Specifically, the effective sensitivity of the photothyristor T to the amount of incoming light is further improved.

[Fifth Exemplary Embodiment]

Figure 15A:
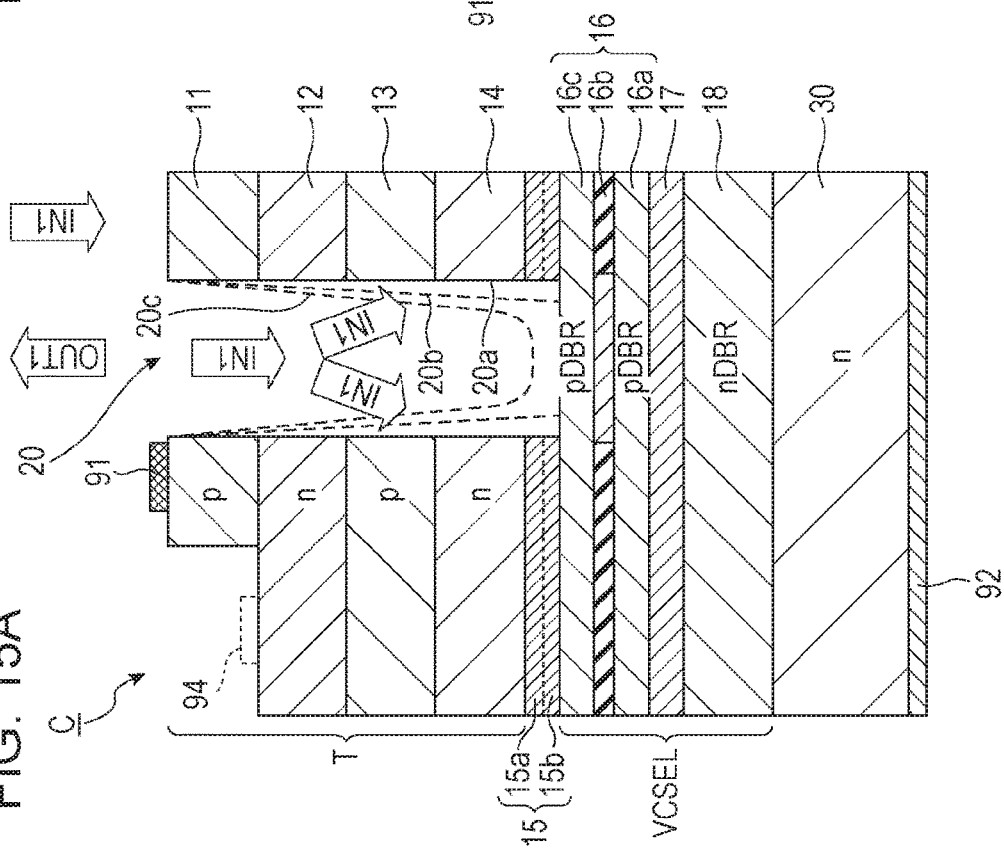
FIG. 15A is a cross-sectional view illustrating an optical switch according to a fifth exemplary embodiment.
Figure 15B:
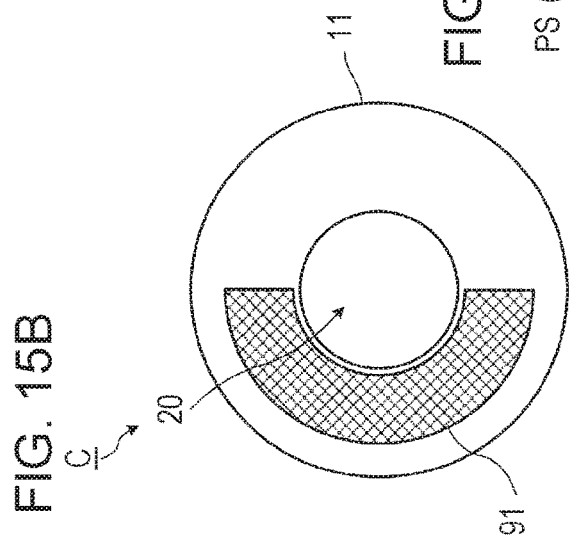
FIG. 15B is a top view of the optical switch.
Figure 15C:
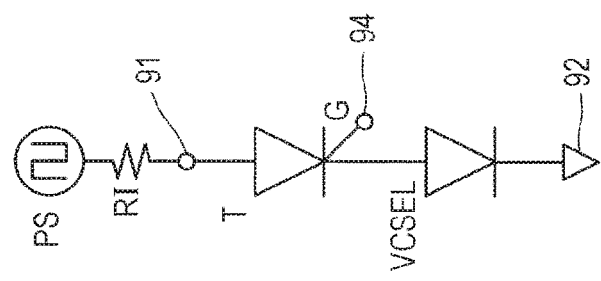
FIG. 15C is an equivalent circuit of the optical switch.

FIGS. 15A, 15B, and 15C illustrate an optical switch C according to a fifth exemplary embodiment. FIG. 15A is a cross-sectional view of the optical switch C, and FIG. 15B is a top view. FIG. 15C shows an equivalent circuit of the optical switch C.

The optical switch C according to the fifth exemplary embodiment includes an n-type substrate 30 (a substrate 30) and further includes a DBR layer (an n-cathode (DBR) layer 18) that functions as a cathode of a VCSEL, a light-emitting layer 17, and a DBR layer (a p-anode (DBR) layer 16), and these layers are disposed on the substrate 30.

A tunnel junction (tunnel diode) layer 15 is disposed on the p-anode (DBR) layer 16. The tunnel junction layer 15 includes a $p^{++}$ layer 15b doped with a p-type impurity (dopant) at a high concentration and an $n^{++}$ layer 15a doped with an n-type impurity at a high concentration.

An n-type cathode layer 14 (an n-cathode layer 14) that functions as a cathode of a photothyristor T, a p-type gate layer 13 (a p-gate layer 13) that functions as a gate, an n-type gate layer 12 (an n-gate layer 12) that functions as another gate, and a p-type anode layer 11 (a p-anode layer 11) that functions as an anode are stacked in this order on the tunnel junction layer 15.

A cathode electrode 92 is disposed on the rear surface of the substrate 30, and an anode electrode 91 is disposed on the front surface of the p-anode layer 11 of the photothyristor T. In FIG. 15A, a control electrode 94 is disposed on an exposed portion of the n-gate layer 12 of the photothyristor T.

Specifically, as shown in FIG. 15C, the optical switch C according to the fifth exemplary embodiment has a structure (a common cathode structure) in which the anodes and cathodes in the optical switch C according to the first exemplary embodiment shown in FIG. 1C are turned upside down.

The other components are the same as those of the optical switch C described in the fourth exemplary embodiment and are denoted by the same numerals, and the description thereof will be omitted.

The metallic conductive III-V compound layer described in the first exemplary embodiment may be used instead of the tunnel junction layer 15, and the voltage reduction layer 19 may be used in the photothyristor T.

[Sixth Exemplary Embodiment]

FIGS. 16A and 16B illustrate an optical switch C according to a sixth exemplary embodiment. FIG. 16A is a cross-sectional view of the optical switch C, and FIG. 16B is a top view. The equivalent circuit of the optical switch C according to the sixth exemplary embodiment is the same as that in the fifth exemplary embodiment shown in FIG. 15C, and therefore the description of the equivalent circuit will be omitted.

In the optical switch C according to the sixth exemplary embodiment, the p-anode (DBR) layer 16 in the optical switch C according to the fifth exemplary embodiment shown in FIG. 15A is replaced with a non-DBR p-anode layer 41, and a tunnel junction layer 15 is used for current confinement.

An n-type DBR layer 42 (an n-DBR layer) is newly provided on the p-anode layer 41.

In this case, the tunnel junction layer 15 is disposed in a portion serving as a current-passing portion α.

Specifically, in the VCSEL, the n-cathode (DBR) layer 18, the light-emitting layer 17, and the p-anode layer 41 are stacked from the substrate 30 side. The tunnel junction layer 15 and the n-DBR layer 42 are stacked on the p-anode layer 41. The photothyristor T including the n-cathode layer 14, the p-gate layer 13, the n-gate layer 12, and the p-anode layer 11 is stacked on the n-DBR layer 42.

A contact portion (a current-blocking portion β) between the p-anode layer 41 and the n-DBR layer 42 is to be reverse biased, and a current is less likely to flow through this portion. However, a current easily flows through the portion (the current-passing portion α) in which the tunnel junction layer 15 is disposed. Specifically, the current is confined by the tunnel junction layer 15.

The n-DBR layer 42 may serve also as the n-cathode layer 14 of the photothyristor T. Therefore, the n-cathode layer 14 may be omitted.

The metallic conductive III-V compound layer described in the first exemplary embodiment may be used instead of the tunnel junction layer 15, and the voltage reduction layer 19 may be used in the photothyristor T.

[Seventh Exemplary Embodiment]

Figure 17B:
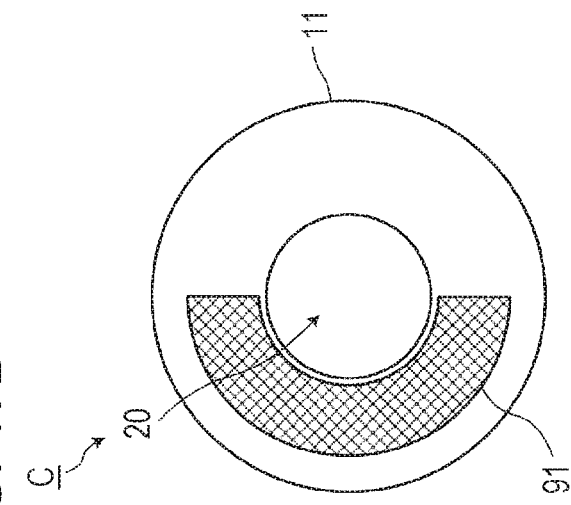
FIG. 17B is a top view of the optical switch.
Figure 17A:
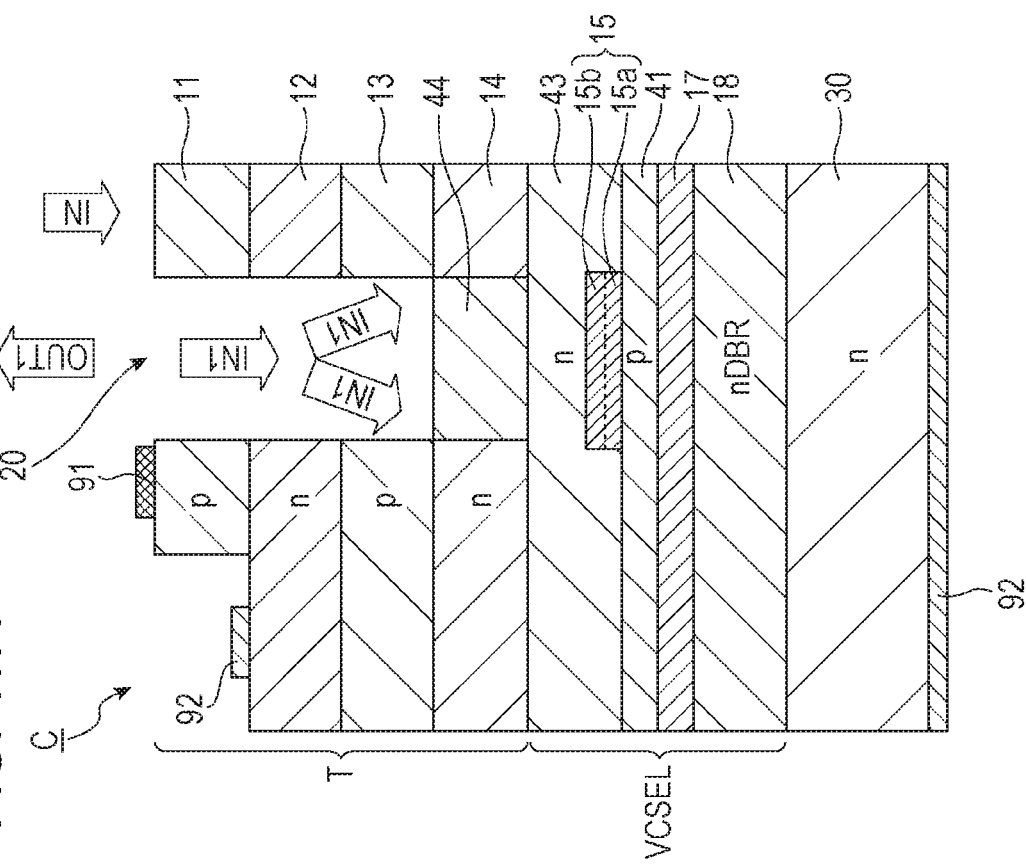
FIG. 17A is a cross-sectional view illustrating an optical switch according to a seventh exemplary embodiment.

FIGS. 17A and 17B illustrate an optical switch C according to a seventh exemplary embodiment. FIG. 17A is a cross-sectional view of the optical switch C, and FIG. 17B is a top view. The equivalent circuit of the optical switch according to the seventh exemplary embodiment is the same as that in the fifth exemplary embodiment shown in FIG. 15C, and therefore the description of the equivalent circuit will be omitted.

In the optical switch C according to the seventh exemplary embodiment, the n-DBR layer 42 in the optical switch C according to the sixth exemplary embodiment shown in FIG. 16A is replaced with a non-DBR n-type layer 43 (an n-layer 43), and a reflecting portion 44 is disposed on the bottom of the opening 20 so as to face the light-emitting layer 17.

The reflecting portion 44 may be, for example, a dielectric multilayer reflecting mirror.

The n-layer may serve also as the n-cathode layer 14 of the photothyristor T, and the n-cathode layer 14 may be omitted.

The metallic conductive III-V compound layer described in the first exemplary embodiment may be used instead of the tunnel junction layer 15, and the voltage reduction layer 19 may be used in the photothyristor T.

[Eighth Exemplary Embodiment]

FIGS. 18A and 18B illustrate an optical switch C according to an eighth exemplary embodiment. FIG. 18A is a cross-sectional view of the optical switch C, and FIG. 18B shows an equivalent circuit.

In a laser element such as the VCSEL, oscillation delay and relaxation oscillation occur when the laser element is switched from the off state to the on state, and responsiveness to an input signal is poor. Therefore, with the laser element such as the above-described VCSEL, modulation at a rate higher than, for example, 1 Gbps is difficult to perform.

In the optical switch C according to the eighth exemplary embodiment, a DC voltage is applied to the laser element such as the VCSEL to cause the laser element to oscillate (be switched to the on state) in advance. In this case, the amount of outgoing light from the VCSEL is set to be small so that the outgoing light is not recognized as a signal. When the photothyristor T is turned on by the incident light, the VCSEL outputs a large amount of outgoing light.

As shown in FIG. 18A, part of the n-cathode (DBR) layer 18 in the optical switch C according to the second exemplary embodiment shown in FIG. 12A is exposed, and an electrode 95 is disposed on the exposed portion. As shown in FIG. 18B, in this optical switch C, a DC voltage $V_0$ is applied to the electrode 95 from a DC power source through a backflow prevention diode DS for prevention of backflow. The backflow prevention diode DS may be disposed outside the optical switch C. Alternatively, a part of the n-gate layer 12, a part of the p-anode layer 11, and a part of the tunnel junction layer 15 formed on the VCSEL may be separated from the photothyristor T, and the electrode 95 may be disposed on the separated part of the n-gate layer 12. The separated parts of the n-gate layer 12 and the p-anode layer 11 that are mentioned above can be used as the backflow prevention diode DS.

It is only necessary that the DC voltage $V_0$ applied to a series circuit including the VCSEL and the backflow prevention diode DS be a voltage sufficient to switch the VCSEL and the backflow prevention diode DS to the on state. In this case, the DC voltage $V_0$ is set such that the amount of outgoing light from the VCSEL is small and the outgoing light is not recognized as a signal.

The VCSEL has been switched to the on state in advance. Therefore, when the incoming light is incident, no oscillation delay and no relaxation oscillation occur, and outgoing light is outputted in quick response to the incoming light. Specifically, with the optical switch C, fast modulation is achieved.

The eighth exemplary embodiment is applicable to the first exemplary embodiment and the third to seventh exemplary embodiments that use the VCSEL. The eighth exemplary embodiment may be applied to other exemplary embodiments that use different laser elements.

[Ninth Exemplary Embodiment]

In the first to eighth exemplary embodiments, the light-emitting element used is the VCSEL.

In a ninth exemplary embodiment, instead of the VCSEL, a light emitting diode LED is used as the light-emitting element.

FIGS. 19A, 19B, and 19C show an optical switch C according to the ninth exemplary embodiment. FIG. 19A is a cross-sectional view of the optical switch C, and FIG. 19B is a top view. FIG. 19C shows an equivalent circuit of the optical switch C.

In the optical switch C according to the ninth exemplary embodiment, the p-anode (DBR) layer 16 and the n-cathode (DBR) layer 18 in the optical switch C according to the first exemplary embodiment shown in FIG. 1A are replaced with a non-DBR p-anode layer 51 and a non-DBR n-cathode layer 52, respectively.

The p-anode layer 51 includes a lower p-anode layer 51a, a current confining layer 51b, and an upper p-anode layer 51c that are stacked in this order.

The lower p-anode layer 51a and the upper p-anode layer 51c are each, for example, p-type $Al_{0.9}GaAs$ with an impurity concentration of $1\times10^{18}/cm^3$. The content of Al may be changed within the range of 0 to 1. GaInP, for example, may also be used.

The n-cathode layer 52 may be, for example, n-type $Al_{0.9}GaAs$ with an impurity concentration of $1\times10^{18}/cm^3$. The content of Al may be changed within the range of 0 to 1. GaInP, for example, may also be used.

The other components are the same as those in the optical switch C according to the first exemplary embodiment, and the description thereof will be omitted.

The stacking order of the light emitting diode LED and the photothyristor T may be changed, as in the optical switch C according to the second exemplary embodiment. The light emitting diode LED may be used instead of the VCSEL in each of the third to eighth exemplary embodiments.

The metallic conductive III-V compound layer described in the first exemplary embodiment may be used instead of the tunnel junction layer 15, and the voltage reduction layer 19 may be used in the photothyristor T. Moreover, other exemplary embodiments may be applied.

[Tenth Exemplary Embodiment]

FIGS. 20A, 20B, and 20C illustrate an optical switch C according to a tenth exemplary embodiment. FIG. 20A is a cross-sectional view of the optical switch C, and FIG. 20B is a top view. FIG. 20C shows an equivalent circuit of the optical switch C.

In the tenth exemplary embodiment, instead of the VCSEL used as the light-emitting element in the optical switch C according to the first exemplary embodiment, a resonant cavity light emitting diode LED is used (Resonant Cavity Light Emitting Diode on Thyristor). The components of the resonant cavity light emitting diode LED are the same as those of the VCSEL used as the light-emitting element in the optical switch C according to the first exemplary embodiment. Therefore, the same numerals are used, and the detailed description of these components will be omitted.

In the resonant cavity light emitting diode LED, the p-anode (DBR) layer 16 and the n-cathode (DBR) layer 18 form a resonator (cavity), and the light emitted from the light-emitting layer 17 is enhanced by resonance and then outputted.

The stacking order of the light emitting diode LED and the photothyristor T may be changed, as in the optical switch C according to the second exemplary embodiment. The resonant cavity light emitting diode LED may be used instead of the VCSEL in each of the third to eighth exemplary embodiments.

The metallic conductive III-V compound layer described in the first exemplary embodiment may be used instead of the tunnel junction layer 15, and the voltage reduction layer 19 may be used in the photothyristor T. Moreover, other exemplary embodiments may be applied.

[Eleventh Exemplary Embodiment]

FIGS. 21A, 21B, and 21C illustrate an optical switch C according to an eleventh exemplary embodiment. FIG. 21A is a cross-sectional view of the optical switch C, and FIG. 21B is a top view. FIG. 21C shows an equivalent circuit of optical switch C.

In the eleventh exemplary embodiment, instead of the VCSEL used as the light-emitting element in the optical switch C according to the first exemplary embodiment, an edge-emitting laser diode LD is used (Laser Diode on Thyristor).

Specifically, the p-anode (DBR) layer 16 and the n-cathode (DBR) layer 18 are replaced with cladding layers (a p-anode (cladding) layer 61 and an n-cathode (cladding) layer 62, respectively), and the light-emitting layer 17 is sandwiched between the two cladding layers.

The p-anode (cladding) layer 61 includes a lower p-anode (cladding) layer 61a including a current confining layer 61b and an upper p-anode (cladding) layer 61c.

The lower p-anode (cladding) layer 61a and upper p-anode (cladding) layer 61c of the p-anode (cladding) layer 61 are each, for example, p-type $Al_{0.9}GaAs$ with an impurity concentration of $5\times10^{17}/cm^3$. The content of Al may be changed within the range of 0 to 1. Moreover, GaInP, for example, may be used.

The n-cathode (cladding) layer 62 may be, for example, n-type $Al_{0.9}GaAs$ with an impurity concentration of $5\times10^{17}/cm^3$. The content of Al may be changed within the range of 0 to 1. Moreover, GaInP, for example, may be used.

The other components are the same as those in the optical switch C according to the first exemplary embodiment, and the description thereof will be omitted.

The cladding layers (the p-anode (cladding) layer 61 and the n-cathode (cladding) layer 62) have a smaller refractive index than the light-emitting layer 17. The light emitted from the light-emitting layer 17 is reflected by the interfaces between the light-emitting layer 17 and these cladding layers to confine the light within the light-emitting layer 17. The light resonates in a resonator formed between end faces (side faces) of the light-emitting layer 17 to allow laser oscillation to occur. Outgoing light OUT3 is emitted in a direction along the surface of the substrate 10.

The cathode electrode 92 is disposed on the n-cathode (cladding) layer 62 of the laser diode LD. Incoming light IN2 may be incident on the p-gate layer 13 or the n-gate layer 12 of the photothyristor T from above or in a direction along the surface of the substrate 10. The incoming light IN2 may be incident on the rear surface of the substrate 10.

The stacking order of the laser diode LD and the photothyristor T may be changed, as in the optical switch C according to the second exemplary embodiment. The resonator laser diode LD may be used instead of the VCSEL in each of the third to eighth exemplary embodiments.

The metallic conductive III-V compound layer described in the first exemplary embodiment may be used instead of the tunnel junction layer 15, and the voltage reduction layer 19 may be used in the photothyristor T. Moreover, other exemplary embodiments may be applied.

The VCSEL, the light emitting diode LED, the resonant cavity light emitting diode LED, and the end resonator laser diode LD have been described as the light-emitting element. Other light-emitting elements such as a light-emitting element having a bipolar transistor structure may also be used.

In the above description, the p-type GaAs is mainly used as an example of the substrate 10. Examples of the semiconductor layers when a different substrate is used (the optical switch C according to the seventh exemplary embodiment shown in FIG. 17A) will be described.

An example of the semiconductor stack when the GaN substrate 30 is used is as follows.

The p-anode layer 11 is, for example, p-type $Al_{0.9}GaN$ with an impurity concentration of $1\times10^{18}/cm^3$. The content of Al may be changed within the range of 0 to 1.

The n-gate layer 12 is, for example, n-type $Al_{0.9}GaN$ with an impurity concentration of $1\times10^{17}/cm^3$. The content of Al may be changed within the range of 0 to 1.

The p-gate layer 13 is, for example, p-type $Al_{0.9}GaN$ with an impurity concentration of $1\times10^{17}/cm^3$. The content of Al may be changed within the range of 0 to 1.

The n-cathode layer 14 is, for example, n-type $Al_{0.9}GaN$ with an impurity concentration of $1\times10^{18}/cm^3$. The content of Al may be changed within the range of 0 to 1.

The tunnel junction layer 15 includes the junction between the $n^{++}$ layer 15a doped with an n-type impurity at a high concentration and the $p^{++}$ layer 15b doped with a p-type impurity at a high concentration (see FIG. 17A). In each of the $n^{++}$ layer 15a and the $p^{++}$ layer 15b, the impurity concentration is high, e.g., $1\times10^{20}/cm^3$. In an ordinary junction, the impurity concentration is of the order of $10^{17}/cm^3$ to $10^{18}/cm^3$. The combination of the $n^{++}$ layer 15a and the $p^{++}$ layer 15b (hereinafter denoted by the $n^{++}$ layer 15a/the $p^{++}$ layer 15b) is, for example, $n^{++}$ GaN/$p^{++}$ GaN, $n^{++}$ GaInN/$p^{++}$ GaInN, or $n^{++}$ AlGaN/$p^{++}$ AlGaN. The materials in the combinations may be mutually exchanged.

The p-anode layer 41 is, for example, p-type $Al_{0.9}GaN$ with an impurity concentration of $1\times10^{18}/cm^3$. The content of Al may be changed within the range of 0 to 1.

On the GaN substrate, it is difficult to use an oxide confining layer as the current confining layer. Therefore, a structure in which the tunnel junction layer or the metallic conductive III-V compound layer is provided in the current-passing portion α may be used. It is also effective that ion implantation is used as a current confining method.

The light-emitting layer 17 has a quantum well structure including well layers and barrier layers stacked alternately. The well layers are, for example, GaAs, InGaAs, or AlGaN, and the barrier layers are, for example, AlGaN or GaN. The light-emitting layer 17 may be quantum wires or quantum boxes (quantum dots).

The n-cathode (DBR) layer 18 is, for example, n-type $Al_{0.9}GaN/Al_{0.1}GaN$ with an impurity concentration of $1\times10^{18}/cm^3$. The content of Al may be changed within the range of 0 to 1.

The reflecting portion 44 in the light-emitting direction may be an n-type or i-type semiconductor multilayer reflecting mirror or a dielectric multilayer reflecting mirror.

An example of the semiconductor stack using an InP substrate is as follows.

The p-anode layer 11 is, for example, p-type InGaAsP with an impurity concentration of $1\times10^{18}/cm^3$. The content of Ga and the content of Al may be changed within the range of 0 to 1.

The n-gate layer 12 is, for example, n-type InGaAsP with an impurity concentration of $1\times10^{17}/cm^3$. The content of Ga and the content of Al may be changed within the range of 0 to 1.

The p-gate layer 13 is, for example, p-type InGaAsP with an impurity concentration of $1\times10^{17}/cm^3$. The content of Ga and the content of Al may be changed within the range of 0 to 1.

The n-cathode layer 14 is, for example, n-type InGaAsP with an impurity concentration of $1\times10^{18}/cm^3$. The content of Ga and the content of Al may be changed within the range of 0 to 1.

The tunnel junction layer 15 includes the junction between the $n^{++}$ layer 15a doped with an n-type impurity at a high concentration and the $p^{++}$ layer 15b doped with a p-type impurity at a high concentration (see FIG. 17A). In each of the $n^{++}$ layer 15a and the $p^{++}$ layer 15b, the impurity concentration is high, e.g., $1\times10^{20}/cm^3$. In an ordinary junction, the impurity concentration is of the order of $10^{17}/cm^3$ to $10^{18}/cm^3$. The combination of the $n^{++}$ layer 15a and the $p^{++}$ layer 15b (hereinafter denoted by the $n^{++}$ layer 15a/the $p^{++}$ layer 15b) is, for example, $n^{++}$ InP/$p^{++}$ InP, $n^{++}$ InAsP/$p^{++}$ InAsP, $n^{++}$ InGaAsP/$p^{++}$ InGaAsP, or $n^{++}$ InGaAsPSb/$p^{++}$ InGaAsPSb. The materials in the combinations may be mutually exchanged.

The p-anode layer 41 is, for example, p-type InGaAsP with an impurity concentration of $1\times10^{18}/cm^3$. The content of Ga and the content of Al may be changed within the range of 0 to 1.

On the InP substrate, it is difficult to use an oxidation confining layer as the current confining layer. Therefore, a structure in which the tunnel junction layer or the metallic conductive III-V compound layer is provided in the current-passing portion α may be used. It is also effective to use ion implantation as the current confining method.

The light-emitting layer 17 has a quantum well structure including well layers and barrier layers stacked alternately. The well layers are, for example, InAs, InGaAsP, AlGaInAs, or GaInAsPSb, and the barrier layers are, for example, InP, InAsP, InGaAsP, or AlGaInAsP. The light-emitting layer 17 may be quantum wires or quantum boxes (quantum dots).

The n-cathode (DBR) layer 18 is, for example, n-type InGaAsP/InGaAsP with an impurity concentration of $1 \times 10^{18}/cm^3$. The content of Ga and the content of Al may be changed within the range of 0 to 1.

The reflecting portion 44 in the light-emitting direction may be an n-type or i-type semiconductor multilayer reflecting mirror or may be a dielectric multilayer reflecting mirror.

These semiconductor layers are deposited by, for example, metal organic chemical vapor deposition (MOCVD) or molecular beam epitaxy (MBE), and the semiconductor stack is thereby formed.

The exemplary embodiments described above may be applied to p-type, n-type, and i-type layers made of organic materials and light-emitting layers made of organic materials.

The exemplary embodiments may be combined with other exemplary embodiments.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An optical switch comprising:
    a photothyristor configured to be switched from an off state to an on state by incident light;
    a light-emitting element configured to emit outgoing light when the photothyristor is in the on state; and
    a tunnel junction layer or a III-V compound layer having metallic conductivity, the tunnel junction layer or the III-V compound layer being disposed between the photothyristor and the light-emitting element.

2. The optical switch according to claim 1, wherein the photothyristor includes a gate layer and a control electrode disposed on the gate layer.

3. The optical switch according to claim 1, wherein the light-emitting element includes a semiconductor layer, and the photothyristor includes a voltage reduction layer having a smaller band gap energy than the semiconductor layer of the light-emitting element.

4. The optical switch according to claim 2, wherein the light-emitting element includes a semiconductor layer, and the photothyristor includes a voltage reduction layer having a smaller band gap energy than the semiconductor layer of the light-emitting element.

5. The optical switch according to claim 1, wherein the light-emitting element has a confined current path.

6. The optical switch according to claim 2, wherein the light-emitting element has a confined current path.

7. The optical switch according to claim 3, wherein the light-emitting element has a confined current path.

8. The optical switch according to claim 4, wherein the light-emitting element has a confined current path.

9. The optical switch according to claim 1, wherein the photothyristor has an opening that is provided in a path configured to output the outgoing light from the light-emitting element.

10. The optical switch according to claim 2, wherein the photothyristor has an opening that is provided in a path configured to output the outgoing light from the light-emitting element.

11. The optical switch according to claim 3, wherein the photothyristor has an opening that is provided in a path configured to output the outgoing light from the light-emitting element.

12. The optical switch according to claim 4, wherein the photothyristor has an opening that is provided in a path configured to output the outgoing light from the light-emitting element.

13. The optical switch according to claim 5, wherein the photothyristor has an opening that is provided in a path configured to output the outgoing light from the light-emitting element.

14. The optical switch according to claim 6, wherein the photothyristor has an opening that is provided in a path configured to output the outgoing light from the light-emitting element.

15. The optical switch according to claim 7, wherein the photothyristor has an opening that is provided in a path configured to output the outgoing light from the light-emitting element.

16. The optical switch according to claim 8, wherein the photothyristor has an opening that is provided in a path configured to output the outgoing light from the light-emitting element.

17. The optical switch according to claim 9, wherein the opening of the photothyristor has a side wall that is inclined to receive the incident light.

18. The optical switch according to claim 1, wherein the photothyristor has a surface configured to receive the incident light, the photothyristor including an electrode formed on the surface, the surface having a portion that is not covered with the electrode.

19. The optical switch according to claim 1, wherein the light-emitting element includes a light-emitting layer, and the optical switch further comprises a distributed Bragg reflector layer that faces the light-emitting layer of the light-emitting element.

20. The optical switch according to claim 1, wherein the optical switch is configured such that, when the photothyristor is in the off state, a bias voltage is applied to the light-emitting element, the bias voltage maintaining a state in which light is outputted from the light-emitting element, the amount of the light being smaller than the amount of the outgoing light.

21. The optical switch according to claim 1, wherein the light-emitting element comprises a vertical-cavity surface-emitting laser, and
    wherein the tunnel junction layer or the III-V compound layer are disposed outside of the vertical-cavity surface-emitting laser.

22. The optical switch according to claim 1, wherein the light-emitting element comprises a light-emitting layer having a quantum well structure,
    wherein the light-emitting layer is configured to emit light toward a top of the light-emitting element, and
    wherein the tunnel junction layer or the III-V compound layer are disposed below the light-emitting layer.

* * * * *